United States Patent
Yamazaki et al.

(10) Patent No.: US 6,807,116 B2
(45) Date of Patent: Oct. 19, 2004

(54) SEMICONDUCTOR CIRCUIT DEVICE CAPABLE OF ACCURATELY TESTING EMBEDDED MEMORY

(75) Inventors: Akira Yamazaki, Hyogo (JP); Atsuo Mangyo, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 68 days.

(21) Appl. No.: 10/383,289

(22) Filed: Mar. 7, 2003

(65) Prior Publication Data

US 2004/0013016 A1 Jan. 22, 2004

(30) Foreign Application Priority Data

Jul. 19, 2002 (JP) ........................................ 2002-211081

(51) Int. Cl.[7] ................................................ G11C 7/00
(52) U.S. Cl. ............. 365/201; 365/189.05; 365/189.06; 365/189.11; 365/202
(58) Field of Search ................................. 365/201, 202, 365/189.05, 189.06, 189.11

(56) References Cited

U.S. PATENT DOCUMENTS 5,991,232 A  11/1999  Matsumura et al.
6,400,625 B2 *  6/2002  Arimoto et al. ............ 365/201
6,418,067 B1  7/2002  Watanabe et al.
6,512,707 B2  1/2003  Miura et al.

FOREIGN PATENT DOCUMENTS

JP          2001-6400          1/2001

* cited by examiner

*Primary Examiner*—Van Thu Nguyen
*Assistant Examiner*—Pho M. Luu
(74) *Attorney, Agent, or Firm*—Leydig, Voit & Mayer, Ltd.

(57) ABSTRACT

A test clock signal for determining timing of transferring a signal to an embedded memory, a memory clock signal for determining timing of latching signal/data of the embedded memory, and a latch timing signal for sampling a signal read from the memory are selectively sampled in accordance with a correcting test clock signal by a common flip flop. The phase differences of the latch timing signal, test clock signal and memory clock signal are measured externally. Thus, it is possible to accurately measure timing conditions such as set up/hold time and access time of the embedded synchronous memory.

12 Claims, 16 Drawing Sheets

F I G. 4
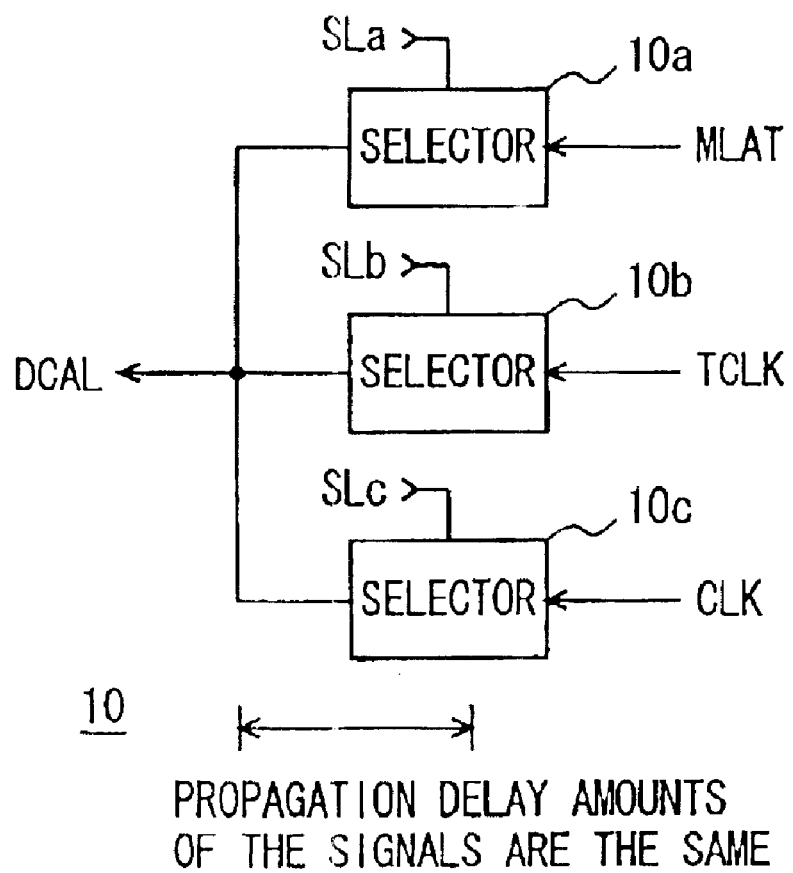
PROPAGATION DELAY AMOUNTS
OF THE SIGNALS ARE THE SAME

FIG. 9 PRIOR ART

| SIGNAL NAME | FUNCTION |
|---|---|
| CLK | CLOCK SIGNAL |
| CKE | CLOCK ENABLE SIGNAL |
| /ACT | ROW ACTIVATING SIGNAL |
| /PRE | ROW INACTIVATING SIGNAL |
| /PEFA | AUTO REFRESH INSTRUCTION SIGNAL |
| /RE | READ OPERATION INSTRUCTION SIGNAL |
| /WR | WRITE OPERATION INSTRUCTION SIGNAL |
| RA<12:0> | ROW ADDRESS SIGNAL |
| CA<3:0> | COLUMN ADDRESS SIGNAL |
| RAsp | SPARE ROW SPACE ADDRESSING ADDRESS SIGNAL |
| CAsp | SPARE COLUMN SPACE ADDRESSING ADDRESS SIGNAL |
| Q<127:0> | READ DATA |
| D<127:0> | WRITE DATA |
| SQ<1:0> | SPARE READ DATA |
| SD<1:0> | SPARE WRITE DATA |

FIG. 10 PRIOR ART

| SIGNAL NAME | FUNCTION |
|---|---|
| TCLK | CLOCK SIGNAL |
| TCKE | CLOCK ENABLE SIGNAL |
| /CS | CHIP SELECT SIGNAL |
| /RAS | ROW ADDRESS STROBE SIGNAL |
| /CAS | COLUMN ADDRESS STROBE SIGNAL |
| /WE | WRITE OPERATION INSTRUCTION SIGNAL |
| AD<12:0> | ROW/COLUMN ADDRESS |
| ADsp | SPARE SPACE ADDRESSING ADDRESS SIGNAL |
| TQ<7:0> | READ DATA OUTPUT SIGNAL |
| TQmbt | MULTI-BIT TEST RESULT OUTPUT SIGNAL |
| TD<7:0> | WRITE DATA INPUT SIGNAL |

FIG. 11 PRIOR ART

| MNEMONIC CODE | TIC CONTROL SIGNALS | | | | DRAM CONTROL SIGNALS | | | | | |
|---|---|---|---|---|---|---|---|---|---|---|
| | /CS | /RAS | /CAS | /WE | /ACT | /PRE | /REFA | /RE | /WR |
| DSEL | H | – | – | – | H | H | H | H | H |
| NOP | L | H | H | H | H | H | H | H | H |
| ACT | L | L | H | H | L | H | H | H | H |
| PRE | L | L | H | L | H | L | H | H | H |
| REFA | L | L | L | H | H | H | L | H | H |
| RE | L | H | L | H | H | H | H | L | H |
| WE | L | H | L | L | H | H | H | H | L |

USER PATENT 6,807,116 B2

SEMICONDUCTOR CIRCUIT DEVICE CAPABLE OF ACCURATELY TESTING EMBEDDED MEMORY

BACKGROUND OF THE INVENTION

1. Field of the Invention

The present invention relates to a semiconductor circuit device, and more particularly to a semiconductor circuit device referred to as a system LSI having memory and logic integrated on the same semiconductor substrate. More particularly, the present invention relates to the configuration of externally testing an embedded memory with respect to signal/data timing conditions.

2. Description of the Background Art

A DRAM-embedded system LSI having a DRAM (Dynamic Random Access Memory) and a logic device or microprocessor integrated on the same semiconductor substrate is becoming wide-spread. The DRAM-embedded system LSI has the following advantages, different from a conventional system in which a discrete DRAM and a discrete logic device or microprocessor are mounted on a printed board with soldering or the like.

(1) Since there are no limitations by pin terminals, the width of a data bus between a DRAM and a logic device can be widened, data transfer rate can be improved, and, accordingly, system performance can be improved.

(2) A data bus between the DRAM and a logic device is formed of on-chip interconnection lines smaller in load than on-board wires. Consequently, an operation current at the time of data transfer can be decreased and data can be transferred at high speed.

(3) Since a system is formed in a single package, external data bus wiring and external control signal wiring are unnecessary, the occupation area of the system on a printed board can be reduced, and the overall system can be downsized.

FIG. 8 is a diagram schematically showing an example of the configuration of a conventional DRAM-embedded system LSI. In FIG. 8, a DRAM-embedded system LSI 500 includes: a logic 502 for performing a predetermined operational process; a DRAM macro 504 for storing at least data required by logic 502; and a logic external bus 508 for connecting logic 502 to an external device via a pad group 518.

Logic 502 may be a logic device dedicated to perform the predetermined operational process, or may be a microprocessor. Logic 502 is merely required to perform a process using data stored in DRAM macro 504.

DRAM macro 504 includes: a DRAM core 510 for storing data; a test interface circuit (TIC) 512 for allowing an external direct access to DRAM core 510 to perform a test; and a selecting circuit 517 for selecting one of an internal logic bus 506 of logic 502 and an internal test bus 516 from test interface circuit 512 and coupling the selected one to an internal memory bus 515 in accordance with a test mode instruction signal MTEST. Internal memory bus 515 is connected to DRAM core 510. Test interface circuit 512 is coupled to pad group 518 via an external test bus 514.

Each of buses 506, 508, 514, 515 and 516 includes signal lines for transmitting a control signal, an address signal and data. Since the internal logic bus 506, internal memory bus 515, and internal test bus 516 do not suffer from limitation due to the count of pin terminals, the bus widths can be made sufficiently wide.

Read data from DRAM core 510 is transferred directly to test interface circuit 512 and logic 502, with selecting circuit 517 bypassed. However, in FIG. 8, to simplify the drawing, a transfer path of internal read data is not shown.

FIG. 8 shows both logic external bus 508 and external test bus 514 being coupled to pad group 518. Alternatively, external test bus 514 and logic external bus 508 may be selectively connected to common pads in accordance with test mode instruction signal (MTEST). In accordance with test mode instruction signal MTEST, selecting circuit 517 couples test interface circuit 512 to DRAM core 510.

FIG. 9 is a diagram showing the signals for DRAM core 510 in a list form. In FIG. 9, to DRAM core 510, a clock signal CLK is supplied as an operation timing determination signal. DRAM core 510 takes in signals/data and outputs data, synchronously with clock signal CLK.

DRAM core 510 receives, as operation control signals, a dock enable signal CKE for setting validity/invalidity of an internal clock signal in DRAM core 510, a row activating signal /ACT for activating an internal row selecting operation, a row inactivating signal /PRE for driving a selected row to a not-selected state, an auto refresh instruction signal /REFA for instructing refresh of memory cell data in DRAM core 510, a read operation instruction signal /RE for instructing reading of data, and a write operation instruction signal /WR for instructing data writing operation.

For designating an address of a memory cell, DRAM core 510 is further supplied with a 13-bit row address signal RA<12:0>, a 4-bit column address signal CA<3:0>, a spare row space addressing address signal RAsp for designating a spare memory cell row, and a spare column space addressing address signal CAsp for designating a spare column.

Spare row space addressing address signal RAsp and spare column space addressing address signal CAsp are used to access a spare memory cell of DRAM core 510 and determine whether the spare memory cell is defective or not in a test performed before a defect address fuse programming.

When spare space addressing address signals RAsp and CAsp are at the H level, a spare memory cell space is designated. When they are at the L level, a normal memory cell space is designated.

To DRAM core 510 is further supplied with data D<127:0> of 128 bits and spare write data SD<1:0> of two bits. From DRAM core 510, read data Q<127:0> of 128 bits and spare read data SQ<1:0> of two bits are outputted. When an address of the spare memory cell space is designated, a spare memory cell for redundancy replacement is designated. Therefore, by designating a spare memory cell by spare space addressing address signals RAsp and CAsp and writing/reading data to/from the designated spare memory cell, the spare memory cell can be tested directly from the outside of the DRAM core.

As shown in FIG. 9, DRAM core 510 has a larger number of input/output signals, as compared with a general discrete DRAM. Test interface circuit 512 generates the signals and data as shown in FIG. 9 for DRAM core 510 in a testing operation in accordance with signals applied from an external tester.

If test interface circuit 512 transmits/receives the signals/data shown in FIG. 9 to/from the external tester by external test bus 514 via pad group 518, the number of lines of the signals/data becomes larger than the number of pins of the external tester, so that a test cannot be performed. Even if a test can be performed, due to the large number of signal lines and data lines necessary for a device to be test, the number of devices which can be measured at the same time decreases, and the test cost increases.

Test interface circuit 512 is provided to reduce the number of pins required in the test and to allow a direct access to DRAM core 510 from the outside of the device to improve testability of DRAM core 510.

FIG. 10 is a diagram showing, in a list form, external signals for test interface circuit 512. The signals shown in FIG. 10 are transferred between an external tester and test interface circuit 512 via external test bus 514 shown in FIG. 8.

In FIG. 10, a test clock signal TCLK and a test clock enable signal TCKE are applied to test interface circuit 512. Test clock signal TCLK and test clock enable signal TCKE are used in a test operation mode in place of clock signal CLK and clock enable signal CKE applied to DRAM core 510 in the normal operation mode.

To test interface circuit 512, further, a chip select signal /CS, a row address strobe signal /RAS, a column address strobe signal /CAS and a write operation instruction signal /WE are applied. In accordance with a combination of logic levels, for example, at the rising edge of the test clock signal, of these control signals /CS, /RAS, /CAS and /WE, an operation mode of the DRAM core is designated.

Test interface circuit 512 decodes the external control signals and selectively activates row activating signal /ACT, row inactivating signal /PRE, auto refresh instruction signal /REFA, read operation instruction signal /RE and write operation instruction signal /WE as shown in FIG. 9 in accordance with a result of the decoding.

As an address signal, 13-bit address signal AD<12:0> and a spare space addressing address signal ADsp are applied to test interface circuit 512. A row address and a column address are applied in a time division multiplexed manner via the common pads (terminals). Spare space addressing address signal ADsp is also applied to a spare row and a spare column in a time division multiplexed manner.

As data, 8-bit test write data TD<7:0>, 8-bit test read data TQ<7:0> and a multi-bit test result instruction signal TQmbt of one bit are transferred between the external tester and test interface circuit 512.

In writing test data, test interface circuit 512 expands the bit width of 8-bit test data TD<7:0> to 128-bit data and supplies the 128-bit data to DRAM core 510 via selecting circuit 517. In expanding the bit width of the test write data, by repeatedly copying 8-bit test data TD<7:0>, 128-bit data of 16 pieces of 8-bit data of the same pattern is generated.

In reading test data, test interface circuit 512 sequentially outputs the 128-bit data read from DRAM core 510 on an 8-bit basis.

Multi-bit test result instruction signal TQmbt is a signal indicative of a result of the multi-bit test on the test read data of 128 bits. By using multi-bit test result instruction signal TQmbt, it becomes unnecessary to determine pass/fail for each of the data of 128 bits. Although the data is outputted on the 8-bit basis, by identifying a defective cell only when the multi-bit result indicates a failure, test time can be shortened.

FIG. 11 is a diagram showing, in a truth table form, the relation between the external control signals (TIC control signals) applied to test interface circuit 512 and the control signals (DRAM control signals) applied to DRAM core 510. An operation mode to be designated is indicated by a mnemonic code.

In FIG. 11, a non-selection state (DSEL) of the DRAM macro is set when chip select signal /CS is at the H level. In this state, DRAM core 510 maintains the non-selection state irrespective of the logic levels of the remaining control signals /RAS, /CAS and /WE.

When chip select signal /CS is set to the L level, an operation mode for DRAM core 510 is designated.

In the case of NOP (No Operation) designating no operation mode, all of the control signals /RAS, /CAS and /WE are set to the H level. In this case, all of the control signals applied to DRAM core 510 maintain the H level, and a new operation mode for DRAM core 510 is not designated. DRAM core 510 usually maintains a standby state when an NOP command is supplied.

When both chip select signal /CS and row address strobe signal /RAS are set to the L level and both column address strobe signal /CAS and write operation instruction signal /WE are set to the H level, ACT indicative of array activation is designated. In this state, to DRAM core 510, row activating signal /ACT is set to an active state at the L level. The remaining DRAM control signals each maintain an inactive state at the H level.

Here, the logic level of the TIC control signal for test interface circuit 512 is determined at the rising edge or falling edge of test clock signal TCLK.

When chip select signal /CS, row address strobe signal /RAS and write operation instruction signal /WE are set to the L level and column address strobe signal /CAS is maintained at the H level, PRE indicative of precharging operation is designated. In this state, row inactivating signal /PRE is set to the L level as a DRAM control signal and DRAM core 510 is reset to the precharge state.

When chip select signal /CS, row address strobe signal /RAS and column address strobe signal /CAS are set to the L level and write operation instruction signal /WE is set to the H level, REFA indicative of a refreshing operation is designated. In this case, auto refresh instruction signal /REFA from among the DRAM control signals is set to the L level, and refreshing operation is executed in DRAM core 510.

When both chip select signal /CS and column address strobe signal /CAS are set to the L level and both row address strobe signal /RAS and write operation instruction signal /WE are set to the H level, RE instructing data reading operation is designated. In this case, read operation instruction signal /RE among the DRAM control signals is set to the active, low state, and the remaining DRAM control signals are maintained at the H level.

When chip select signal /CS, column address strobe signal /CAS and write operation instruction signal /WE are set to the L level and row address strobe signal /RAS is set to the H level, WE instructing data writing operation is designated. In this state, write operation instruction signal /WR among the DRAM control signals is set to the L level.

In test interface circuit 512, in accordance with the truth table shown in FIG. 11, a TIC control signal is translated into a DRAM control signal. By performing multiplexing of addresses, conversion of the data bit width, and translation of the control signals in test interface circuit 512, the number of pin terminals used when the external tester accesses DRAM core 510 and performs a testing operation can be significantly reduced. The control signals supplied to test interface circuit 512 are the same as those used for a normal clock synchronous DRAM. Therefore, DRAM core 510 can be tested using a tester for a standard clock synchronous DRAM.

FIG. 12 is a diagram schematically showing the configuration of DRAM core 510 and test interface circuit (TIC)

512 shown in FIG. 8. In FIG. 12, selector (selecting circuit) 517 disposed between DRAM core 510 and test interface circuit 512 is not shown in order to simplify the drawing.

In FIG. 12, DRAM core 510 includes: DRAM arrays 550e and 550w each having a plurality of memory cells arranged in rows and columns; and a decoder 552 for selecting a memory cell from DRAM arrays 550e and 550w in accordance with an address signal.

Each of DRAM arrays 550e and 550w has a storage capacity of, for example, 8 M bits.

In DRAM arrays 550e and 550w, spare rows and spare columns for repairing a defective memory cell are disposed.

Decoder 552 includes both a row decoder for selecting a memory cell row in DRAM arrays 550e and 550w and a column decoder for selecting a memory cell column.

By disposing the row decoder and the column decoder in the same direction, internal multi-bit data bus lines can be laid over the memory cell arrays (DRAM arrays), so that the chip area can be reduced. The configuration of disposing the column decoder for column selection and the row decoder for row selection in the same direction is generally used for a logic-merged DRAM macro.

DRAM core 510 further includes: a DRAM data path 556e for inputting/outputting data to/from DRAM array 550e; a DRAM data path 556w for inputting/outputting data to/from DRAM array 550w; and a DRAM control circuit 558 for controlling an internal operation of DRAM core 510.

Each of DRAM data paths 556e and 556w includes: a write driver for transferring internal write data to corresponding DRAM array 550e or 550w; and a preamplifier for amplifying memory cell data read from corresponding DRAM array 550e or 550w.

DRAM data path 556e transfers write data WD<127:64> via a write data bus 551e of a 64-bit width and receives internal read data RD<127:64> of 64 bits transferred from DRAM array 550e via an internal read data bus 553e.

A column selection line from the column decoder provided in decoder 552 is disposed extending in the row direction. In DRAM array 550e, a spare column is selected simultaneously with a normal column. In repairing a defective column, therefore, DRAM data path 556e transfers spare write data SWD<1> via a spare write data line 557e and receives spare read data SRD<1> from a spare memory cell via a spare read data line 559e.

Similarly, DRAM data path 556w transfers internal write data WD<63:0> to DRAM array 550w via an internal write data bus 551w of a 64-bit width and receives internal read data RD<63:0> of having a width of 64 bits from DRAM array 550w via an internal read data bus 553w.

In repairing a defective column, DRAM data path 556w further receives spare read data SRD<1> read from a spare column via a spare read data line 559w and transfers spare write data SWD<0> to a spare column via a spare write data line 557w.

At the time of repairing a defective column in an normal operation mode, DRAM data path 556e replaces a corresponding write data line in internal write data bus 550e with spare write data line 557e, or replaces a corresponding internal read data line in internal read data bus 553e with spare read data line 559e. Similarly, at the time of repairing a defective column in the normal operation mode, DRAM data path 556w replaces a corresponding internal read data line in internal read data bus 553w with spare read data line 559w, or replaces a corresponding internal write data line in internal write data bus 551w with spare write data line 557w.

In a test mode for repair determination performed before programming a defect address for repairing a defective column, a normal memory cell and a spare memory cell are tested, and a test for detecting whether the spare memory cell is non-defective is performed. In a memory test for repair determination, spare read data lines 559e and 559w and spare write data lines 557e and 557w in DRAM data paths 556e and 556w transmit/receive data to/from test interface circuit 512 without replacing normal data lines.

Test interface circuit 512 includes: TIC data paths 560e and 560w provided in correspondence to DRAM data paths 556e and 556w, respectively; and a TIC control circuit 562 for transmitting/receiving test write data TD<7:0>, test read data TQ<7:0> and multi-bit test result instruction signal TQmbt to/from the external tester.

TIC control circuit 562 receives control signals designating the addressing and an operation mode as shown in FIG. 10 from the external tester. However, in FIG. 12, the control signals and address signals applied to TIC control circuit 562 are not shown for the purpose of simplifying the drawing.

At the time of writing test data, TIC data paths 560e and 560w expand test write data TD<7:0> of eight bits to test data of 64 bits and transfer the test data of 64 bits to DRAM data paths 556e and 556w via corresponding data buses 561e and 561w, respectively.

At the time of reading data, TIC data paths 560e and 560w receive read data of 64 bits (read data of 128 bits in total) from DRAM data paths 556e and 556w via data buses 563e and 563w, respectively.

TIC data path 560e receives 64-bit data Q<127:64> from DRAM data path 556e via data bus 563e and also receives spare read data SRD<1> from spare internal read data line 559e transmitted via DRAM data path 556e, as spare data SQ<1> via a spare read data line 569e.

TIC data path 560e transfers 64-bit write data D<127:64> to DRAM data path 556e via internal write data bus 561e, and also transfers spare write data SD<1> to internal spare write data line 557e via spare write data line 567e.

Similarly, TIC data path 560w receives internal read data Q<63:0> from DRAM data path 556w via read data bus 563w and receives spare read data SQ<0> via spare data line 569w. TIC data path 560w transfers 64-bit data D<63:0> to DRAM data path 556w via write data bus 561w and transfers spare write data SD<0> to DRAM data path 556w via spare write data line 567w.

At the time of reading data, TIC control circuit 562 sequentially outputs the data of 128 bits in total supplied to TIC data paths 560e and 560w as test data TQ<7:0> on an 8-bit data basis.

TIC control circuit 562 transfers the signal TQmbt indicative of a result of the multi-bit test on the 128-bit data simultaneously read via multi-bit signal line 573. When multi-bit test result indication signal TQmbt indicates mismatch, in the external tester, a defective memory cell is identified on the basis of test read data TQ<7:0> and expected value data.

FIG. 13 is a diagram schematically showing the configuration of a part related to data writing of TIC data paths 556e and 556w shown in FIG. 12. FIG. 13 also shows the configuration of a part for generating write data of TIC control circuit 562.

TIC control circuit 562 includes a cycle shifting circuit 600 for transferring test data TD<7:0> of eight bits in accordance with test clock signal TCLK. Cycle shifting circuit 600 delays supplied test data TD<7:0> by a predetermined cycle period of test clock signal TCLK and outputs the delayed data.

To TIC control circuit 562, address signal AD<12:0> of 13 bits and spare address space addressing address signal ADsp are applied.

From cycle shifting circuit 600, data Df<7:0> of eight bits is generated in synchronization with test clock signal TCLK.

TIC data path 560e includes drive circuits DRE0 to DRE7 for copying data Df<7:0> to generate data of eight bits, and a driver SDRe for copying 1-bit data Df<7> to generate spare data SD<1>.

Drive circuits DRE0 to DRE7 each including drivers of 8 bits generate 8-bit data D<64:71>, D<72:79>, . . . and D<120:127>, respectively. Each of 8-bit data D<64:71>, D<72:79>, . . . and D<120:127> has the same data pattern as data Df<7:0>.

Driver SDRe is formed by a 1-bit drive circuit and generates spare write data SD<1> by buffering data Df<7>.

Similarly, TIC data path 560w includes drive circuits DRW0 to DRW7 each for copying data Df<7:0> to generate data of eight bits, and a driver SDRw for buffering data Df<7> to generate spare data SD<0>.

Drive circuits DRW0 to DRW7 generate 8-bit data D<7:0>, D<15:8>, . . . and D<63:56>, respectively. Each of 8-bit data generated by TIC data path 560w has the same data pattern.

Data of 128 bits is generated by expanding the bit width of test data TD<7:0>, and therefore, the data pattern of the 128-bit data satisfies the following condition;

$$D<8 \cdot n+m>=TD<m>,$$

wherein n is an integer ranging from 0 to 15 and m is an integer ranging from 0 to 7.

By copying data Df<7:0> in TIC data paths 560e and 560w, 128-bit internal data can be generated from the 8-bit external data and transmitted to the DRAM core, and spare write data SD<0> and SD<1> can be transferred to the DRAM core. Spare write data SD<0> and SD<1> have the same logic level as that of test data TD<7>.

FIG. 14 is a diagram schematically showing the configuration of a data reading part of TIC data paths 560e and 560w shown in FIG. 12. Since TIC data paths 560e and 560w have the same configuration, in FIG. 14, the configuration of TIC data path 560w is specifically shown and the configuration of TIC data path 560e is simply shown by blocks.

TIC data path 560w includes: unit processing circuits UPW0 to UPW7 disposed in correspondence to 8-bit data Q<7:0> to Q<63:56>, respectively; and a tri-state buffer 600e provided in correspondence to spare read data SQ<0>. Unit processing circuits UPW0 to UPW7 have the same configuration and each includes: a tri-state buffer circuit 610 for buffering 8-bit data Q when activated, to generate internal data TQf<7:0>; and a comparing circuit 612 for comparing corresponding 8-bit internal read data with expected value data CMPD<7:0>, and outputting 1-bit data indicating the comparison result.

Tri-state buffer circuit 610 is activated by a corresponding selection signal QSEL among 16-bit selection signal QSEL<15:0> generated in accordance with an address signal from TIC control circuit 562. Tri-state buffer 600e is selectively activated in accordance with a selection signal SQSEL<0> from the TIC control circuit.

TIC data path 560e includes: a tri-state buffer circuit 600e provided in correspondence to spare data SQ<1>; and unit processing circuits UPE0 to UPE7 provided in correspondence to 8-bit data Q<64:71> to Q<120:127>, respectively. Unit processing circuits UPE0 to UPE7 are also selectively activated in accordance with a corresponding selection signal of 16bit selection signal QSEL<15:0>.

Each of unit processing circuits UPE0 to UPE7 includes: a tri-state buffer circuit for buffering 8-bit data when activated, to generate internal read data TQf<7:0>; and comparing circuit 612 for performing a multi-bit test of determining the match/mismatch between expected value data CMPD<7:0> and corresponding data bits and outputting 1-bit signal indicative of a result of comparison.

Comparing circuit 612 compares 8-bit expected value data CMPD<7:0> with corresponding 8-bit data D<8·n+7:8·n> bit by bit and then compresses the 8-bit signals of the comparison result to a signal Qmbtf<n> of one bit. A signal Qmbtf<15:0> of 16 bits indicative of a result of comparison from comparing circuit 612 is further compressed by TIC control circuit 562, and multi-bit result indication signal TQmbt of one bit is generated and transferred to the external tester. At the time of compression, whether the logic level of each bit in 16bit signal Qmbtf<15:0> indicates a match state or not is simply determined (AND operation is performed).

FIG. 15 is a diagram schematically showing the configuration of a part for generating a selection signal shown in FIG. 14 of TIC control circuit 562. In FIG. 15, TIC control circuit 562 includes: a flip flop circuit 620 for transferring address signals AD<12:0> and ADsp synchronously with test clock signal TCLK and generating internal address signals intAD<12:0> and intADsp; a flip flop circuit 621 for transferring internal address signals intAD<12:0> and intADsp from flip flop circuit 620 synchronously with test clock signal TCLK and generating row address signal RA<12:0> and spare row addressing address signal RAsp; a flip flop circuit 622 for transferring address signal intAD<3:0> of four bits from flip flop circuit 620 synchronously with test dock signal TCLK and generating column address signal CA<3:0>; cascaded flip flop circuits 623 to 625 of three stages for transferring internal address signals intAD<9:6> of four bits and intADsp from flip flop circuit 620; and a decoder 626 for decoding an output signal of flip flop circuit 625 and generating selection signals QSEL<15:0> and SQSEL<1:0>.

Flip flop circuits 623 to 625 of three stages are disposed in the preceding stage of decoder 626 in order to delay the output signal of decoder 626 by a period corresponding to latency in reading test data. The latency indicates the time period required since a read operation instruction signal instructing data reading is supplied from test interface circuit 512 to DRAM core 510 until test data is read from DRAM core 510 and transferred to test interface circuit 512. Here, it is assumed that the latency is 2.

Each of flip flop circuits 620 to 625 takes in and outputs a received signal synchronously with the rising edge of test clock signal TCLK.

FIG. 16 is a timing chart representing operations in reading test data of the DRAM macro shown in FIGS. 12 to 15. Referring to FIG. 16, the operation of reading test data of the DRAM macro will be described below.

Test interface circuit (TIC) 512 delays the control signals externally applied by one clock cycle of test clock signal TCLK and transfers the control signals to DRAM core 510. Therefore, DRAM core 510 takes in the control signal and an address signal at the rising edge of test clock signal TCLK and executes an internal operation after two cycles when the control signals and others are applied from the tester to test interface circuit 512. It is assumed in FIG. 16 that clock signal CLK and test clock signal TCLK supplied to DRAM core 510 are the signals having the same waveform.

At time T1, a control signal instructing row activation, ACT is supplied to test interface circuit 512 and, at the same time, a row address signal RA(k) of 13 bits is applied. Test interface circuit (TIC) 512 decodes the control signals externally applied and transfers row activating signal /ACT to DRAM core 510 synchronously with the rising edge of clock signal TCLK in accordance with a result of the decoding. As shown in FIGS. 10 and 11, the control signals applied to DRAM core 510 are each a signal of negative logic. In FIG. 16, operation mode instruction signals are indicated by mnemonic codes shown in FIG. 11.

As shown in FIG. 15, row address signal RA(k) is transferred from flip flop circuit 621 synchronously with the rising edge of test clock signal TCLK.

In DRAM core 510, at time T3, row activating signal ACT is taken in together with row address signal RA(k) synchronously with the rising edge of clock signal CLK and a row selecting operation is internally executed.

At time T2, a write operation instruction signal instructing data writing is supplied together with column address signal CA(m) and test data TD(m) to test interface circuit (TIC) 512. Synchronously with the rising edge of test clock signal TCLK, the control signal, column address signal and test data are taken in by test interface circuit (TIC) 512.

In test interface circuit (TIC) 512, control signal decoding operation is performed. Synchronously with the rising edge of dock signal TCLK at time T3, write operation instruction signal WRITE for DRAM core 510, column address signal CA(m) and test data TD(m) are transferred to DRAM core 510.

In DRAM core 510, synchronously with the rising edge of clock signal CLK at time T4, write operation instruction signal WRITE, column address signal CA(m) and data D(m) are taken in, a column selecting operation is executed, and data D(m) of 128 bits are written into the columns designated by column address CA(m).

At time T3, a command (READ) instructing data reading is supplied together with column address signal CA(n) and test data TD(n) to test interface circuit (TIC) 512. Test data TD(n) at the time of data reading is used as expected value data CMPD<7:0> for performing comparison in a data path of test interface circuit 512.

Test data TD(n) supplied to test interface circuit (TIC) 512 at time T3 are not transferred to DRAM core 510 because data writing is not performed in the TIC data path. Particularly, according to the timings shown in FIG. 16, the comparison data (expected value data) is generated by internally shifting data supplied from the external tester by a predetermined cycle period in consideration of column latency at the time of data reading, and is applied to comparing circuit 612 provided in test interface circuit (TIC) 512. Therefore, in receiving comparison data, write data to be written in accordance with the write command is transferred within test interface circuit (TIC) 512 and transferred to the DRAM core. Consequently, even when write data is supplied together with the read command to test interface circuit (TIC) 512, no problem arises.

However, where comparison data CMPD<7:0> is required to be inputted in a cycle earlier than application of the read command due to limitations of the number of delay stages for internally generating comparison data, there occurs such a limitation that the writing operation cannot be performed in the cycle of inputting the comparison data.

The command (READ) supplied to test interface circuit (TIC) 512 at time T3 is decoded in test interface circuit (TIC) 512, read operation instruction signal READ is generated, and read operation instruction signal READ and column address signal CA(n) are supplied to DRAM core 510 synchronously with the rising edge of test clock signal TCLK at time T4. The term "command" is used as indicating an operation mode instruction provided by a combination of a plurality of control signals represented by the mnemonic codes of FIG. 11.

In DRAM core 510, synchronously with the rising edge of clock signal CLK at time T5, a column selecting operation is started in accordance with read operation instruction signal READ (/RE) and column address signal CA(n), and test data is read internally.

At time T4, a control signal (PRE) instructing precharging operation is supplied to test interface circuit (TIC) 512 and decoded in test interface circuit (TIC) 512, and row inactivating signal PRE is generated and transferred to DRAM core 510. At time T6, row inactivating signal PRE is taken in by DRAM core 510 and the internal precharging operation is executed.

In DRAM core 510, column latency is two cycles, data internally read in accordance with read operation instruction signal READ supplied at time T5 is read in a clock cycle starting at time T6, and read data Q(n) is applied to test interface circuit (TIC) 512.

In test interface circuit (TIC) 512, in the clock cycle starting at time T6, buffer circuit 610 is selectively activated in accordance with a selection signal from decoder 626 shown in FIG. 15, 8-bit data is generated from data Q(n) of 128 bits transferred from DRAM core 510, and comparing circuit 612 compares data TD(n) taken in at time T3 and the read data and generates a signal indicative of the comparison result. Generation of the 8-bit data and the comparison result indication signal are completed by time T7.

In a clock cycle starting at time T7, test interface circuit (TIC) 512 outputs 8-bit test data TQ(n) together with multi-bit test result indication signal Qmbt(n). Decoder 626 and flip flop circuits 620 to 625 shown in FIG. 15 always operate synchronously with test clock signal TCLK. Therefore, by sequentially applying address signals intAD<9:6> and ADsp shown in FIG. 15 in each clock cycle, 8-bit data is sequentially selected in accordance with selection signals QSEL<15:0> and SQSEL<1:0> outputted from decoder 626, and read from test interface circuit (TIC) 512.

Alternatively, decoder 626 may include an address counter for internally performing a counting operation synchronously with test clock signal TCLK, to generate a column address, and decodes the column address to generate selection signal QSEL<15:0>.

In the external tester, when multi-bit test result indication signal Qmbt(n) (TQmbt) indicates the mismatch with respect to 8-bit test data TQ(n), test expected value data TD(n) and test read data TQ(n) is compared with each other bit by bit on the 8-bit data basis, thereby identifying the position of a defective memory cell. Multi-bit result indication signal TQmbt is a signal indicative of match/mismatch of 128-bit data simultaneously selected. When multi-bit test result indication signal Qmbt(n) indicates matching, it is determined that all bits of 128-bit test data TQ(n) are non-defective.

The external tester is not required to identify the position of a defective memory cell with respect to all of 8 bits for each 8-bit test data, so that the test time is shortened.

By using test interface circuit 512 as described above, whether a memory cell is defective can be determined by accessing DRAM core 510 externally.

The test of DRAM core 510 includes, other than the above, measurement of setup time, hold time, access time and others. Conventionally, a test with respect to timing relationship of the signals of such a DRAM core 510 is performed as follows.

FIG. 17 is a block diagram schematically showing the relation of input/output signals of test interface circuit 512 and DRAM core 510. In FIG. 17, test interface circuit (TIC) 512 includes: a flip flop circuit 700 for taking in and transferring a TIC input signal synchronously with the rising edge of test clock signal TCLK; an input interface converting logic 702 for converting a signal/data from flip flop circuit 700 into a signal/data according to the interface of the DRAM core; and a flip flop circuit 704 for taking in and transferring an output signal/data of input interface converting logic 702 synchronously with the rising edge of test clock signal TCLK.

The TIC input signal includes test write data, an address signal and a control signal (command) supplied from the external tester. Input interface converting logic 702 includes a circuit of expanding bit width of test write data, and a decoder for decoding a command and generating an operation mode instruction signal to the DRAM core. Therefore, flip flop circuit 700 includes flip flop circuit 620 shown in FIG. 15, and flip flop circuit 704 includes flip flop circuits 621 and 622 shown in FIG. 15.

Test interface circuit (TIC) 512 further includes: an output interface converting logic 706 for converting a signal (read data RD) from DRAM core 510 into data/a signal according to an output interface; and a flip flop circuit 708 for taking in and transferring an output signal/data of output interface converting logic 706 synchronously with test clock signal TCLK and generating a TIC output signal.

Output interface converting logic 706 includes a circuit portion for generating output data TQ<7:0> and multi-bit test result indication signal TQmbt in the TIC data path and TIC control circuit 562 shown in FIG. 14.

Test interface circuit (TIC) 512 further includes a flip flop 710 for taking in and transferring data read from the DRAM core in accordance with latch timing signal MLAT from the external tester. An output signal QLAT from flip flop 710 is supplied to the tester and whether data is accurately read or not is determined.

In the signal/data input portion of DRAM core 510, a flip flop circuit 720 for taking in a signal/data supplied synchronously with the rising edge of clock signal CLK is provided. In the data output portion, a flip flop circuit 725 for outputting data synchronously with clock signal CLK is provided. The setup/hold time of the signal/data in DRAM core 510 is measured by using the rising edge clock signal CLK supplied to flip flop circuit 720. Access time is represented by the time required for a core output signal (read data RD) read from flip flop 725 to reach output interface converting logic 706 of test interface circuit (TIC) 512.

In the case of measuring the setup/hold time, memory write data WD, address signal AD and control signal CTL are transferred from flip flop circuit 704 of test interface circuit (hereinafter, simply referred to as TIC) 512 synchronously with test clock signal TCLK. Consequently, by making the phase of test clock signal TCLK and the phase of clock signal CLK supplied to flip flop circuit 720 shifted from each other, the setup/hold time is measured.

FIG. 18 is a timing chart representing an operation in measuring signal parameters such as setup/hold time and access time. Referring to FIG. 18, the signal parameter measuring operation in test interface circuit 512 shown in FIG. 17 will be described below.

In measuring the setup/hold time, as shown by a waveform SHM in FIG. 18, the phase of test clock signal TCLK is made varied with respect to the phase of clock signal CLK. Specifically, while varying the leading extent of the phase of test clock signal TCLK with respect to the rising edge of clock signal CLK for causing flip flop circuit 720 to take in a signal/data in DRAM core 510, to thereby change setup time, tsu, whether data can be written/read or not accurately is determined. In measuring the setup time, tsu, the setup time of DRAM core 510 is measured in accordance with a binary search method. In measurement of setup time in accordance with the binary search method, the setup time is measured along the following procedure. Specifically, whether DRAM core 510 operates correctly or not is measured by using an intermediate value between the setup time in which all of DRAM cores operate correctly (referred to as maximum measurement value) and the setup time in which all of DRAM cores operate erroneously (referred to as minimum measurement value) as a first setup time measurement value (initial value). When DRAM core 510 operates correctly, DRAM core 510 is operated by using an intermediate value between the initial value and the minimum measurement value as a second measurement value, and whether DRAM core 510 operates correctly or not is measured. According to the measurement result, the next measurement value is set. That is, when DRAM core 510 operates correctly, measurement is further performed by using an intermediate value between the second measurement value and the minimum measurement value. If an erroneous operation occurs, measurement is performed by using an intermediate value between the second measurement value and the initial value. In such a manner, the measuring operation is repeatedly executed, a boundary value between the setup time in which DRAM core 510 operates correctly and the setup time in which DRAM core 510 operates erroneously is obtained and is determined to be the setup time of DRAM core 510.

Similar procedure applies to the hold time, th. By delaying the phase of test clock signal TCLK behind clock signal CLK, the hold time, th of a core input signal Cn−1 shown in FIG. 18 is changed. Similarly, a phase delay amount of test clock signal TCLK relative to clock signal CLK is adjusted in accordance with the binary search method, and the hold time, th is measured.

In measuring an access time, the transmission time of read data from DRAM core 510 to logic 502 assembled on the same semiconductor substrate has to be measured. In this case, therefore, with respect to a specific bit in read data from flip flop circuit 725 of DRAM core 510, by changing the phase of latch timing signal MLAT from the external tester, whether target data is read or not is measured. Specifically, in FIG. 18, as shown by an waveform ATM, the phase of latch timing signal MLAT is changed with respect to the rising edge of dock signal CLK and whether output data QLAT from flip flop circuit 710 is data Qm−1 or Qm is identified. The boundary value between the access time in which target data Qm is correctly read and the access time in which data Qm−1 is read is obtained in accordance with the binary search method, thereby measuring the access time of DRAM core 510.

In FIG. 18, clock signals CLK and TCLK are signals having the same waveform. Clock signals CLK and TCLK and latch timing signal MLAT are applied from the external tester. The phase relation of the signals CLK, TCLK and MLAT can be determined by the external tester. The setup time/hold time and access time can be measured in accordance with the binary search method on the basis of a set phase difference.

FIG. 19 is a diagram schematically showing transfer paths of the signals CLK, TCLK and MLAT between a tester 750 provided externally and DRAM-embedded system LSI (semiconductor integrated circuit device) 500. In FIG. 19, in system LSI 500, clock signal CLK, test clock signal TCLK and latch timing signal MLAT are received via pads 760*a*, 760*b* and 760*c*, respectively. Clock signal CLK supplied to pad 760*a* is transferred to DRAM core 510 via an internal line 762*a*. Test clock signal TCLK supplied to pad 760*b* is transferred to test interface circuit (TIC) 512 via an internal line 762*b*. Latch timing signal MLAT transferred to pad 760*c* is transferred to test interface circuit 512 via an internal line 762*c*.

Since internal lines 762*a*, 762*b* and 762*c* are different in length and load, and therefore, also different in signal propagation delay amount. Pads 760*a*, 760*b* and 760*c* are connected to a lead frame via bonding wires at the time of packaging. Therefore, where the wiring lengths between the lead frame and pads 760*a*, 760*b* and 760*c* are different, similarly, signal propagation delay amounts are different from each other.

Consequently, the relative timing relationship of the signals CLK, TCLK and MLAT in the system LSI becomes different from the relationship at the time of setting in the external tester due to various signal propagation delay amounts in system LSI 500. It causes a problem such that accurate setup time, hold time and access time cannot be measured in the external tester.

As shown in FIG. 20, for example, when the phase of an internal waveform is deviated due to a deviation of signal propagation delay, in order to make correction of the phase deviation to the set phase change amount Tset of the test clock signal TCLK relative to clock signal CLK, it is required to measure the internal signal waveform using an apparatus such as an oscilloscope for measuring a correction value in advance. However, even when a correction value is measured with respect to one device, the correction value cannot be used for a device of another kind having a different user logic and a different pad layout or frame. Even in a device of the same kind, there is the possibility that the correction value measured with respect to one device cannot be used due to variations in resistance value and capacitance value of an internal line in fabrication process.

After packaging with a mold resin or the like, the internal waveform cannot be monitored at all, so that the correction value itself cannot be measured.

Particularly, in the case of operation synchronized with a high-speed clock signal requiring a more severe specification condition, if the setup time, the hold time and the access time cannot be measured with high precision, a defective device cannot be screened by a DRAM macro sole test. In this case, a defective DRAM macro is assembled in a final product, and such problems arise that the yield in final product test reduces and a product cost increases.

SUMMARY OF THE INVENTION

An object of the present invention is to provide a semiconductor circuit device capable of measuring an internal signal timing of an embedded clock synchronous memory with high precision.

Another object of the present invention is to provide a test interface circuit capable of accurately measuring setup/hold time or access time of an embedded memory.

Still another object of the present invention is to provide a test interface circuit capable of screening a defective embedded DRAM core with high precision, thereby improving the yield of a final product.

A semiconductor circuit device according to a first aspect of the present invention includes: a memory core operating synchronously with a memory clock signal; a memory transferring circuit for transferring a signal/data to the memory core synchronously with a test clock signal; a timing selecting circuit receiving at least the memory clock signal and the test clock signal, and selecting one of the memory clock signal and test clock signal; and a timing transferring circuit for taking in and transferring externally an output signal of the timing selecting circuit synchronously with a correcting test clock signal.

A semiconductor circuit device according to a second aspect of the present invention includes: a memory core taking in supplied data synchronously with a memory clock signal; a memory transferring circuit for transferring multi-bit data to the memory core; a replica circuit having the same data transfer characteristics as the memory transferring circuit; a test data selecting circuit for selecting one of the memory clock signal and an output signal of the replica circuit; and a test data transferring circuit for transferring an output signal of the test data selecting circuit synchronously with a correcting test clock signal.

A semiconductor circuit device according to a third aspect of the present invention includes: a memory core operating synchronously with a memory clock signal; a latch transferring circuit for taking in and transferring externally a signal transferred from the memory core synchronously with a latch timing signal; and a test transferring circuit for selecting one of the memory clock signal and the latch timing signal in accordance with a selection signal, and externally transferring that selected signal synchronously with a correcting clock signal.

By selecting one of the memory clock signal and the test clock signal and transferring the selected clock signal synchronously with the correcting clock signal, the phase of the test clock signal or memory clock signal relative to the phase of the correcting clock signal can be detected by the external tester, and the phase difference between the memory clock signal and the test clock signal can be accordingly detected. By using the phase difference, a measurement value of setup time, the hold time or the access time can be corrected, and the setup time, the hold time or the access time can be measured with high precision.

By selectively transferring an output signal of a replica circuit having the same transfer characteristic as that of a data transferring circuit and a memory clock signal synchronously with a clock signal for correction, the phase difference between write data and the memory clock signal can be detected by using the clock signal for correction as a reference by the external tester. Thus, setup time and hold time of the write data can be corrected with high precision, and the setup time or hold time can be accordingly measured with high precision.

By transferring one of the latch timing signal and the memory clock signal synchronously with the correcting clock signal, the phase difference between the latch timing signal and the memory clock signal can be detected, a measured access time value can be accurately corrected, and accurate access time can be determined.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a diagram schematically showing the configuration of a selecting circuit in FIG. 1;

FIG. 9 is a diagram showing, in a list form, the signals to a DRAM core in the system LSI shown in FIG. 8;

FIG. 10 is a diagram showing, in a list form, the signals applied to the test interface circuit shown in FIG. 8;

FIG. 11 is a diagram showing, in a list form, corresponding relationship of the signals applied to the test interface circuit and the signals applied to the DRAM core;

DESCRIPTION OF THE PREFERRED EMBODIMENTS

First Embodiment

Figure 1:
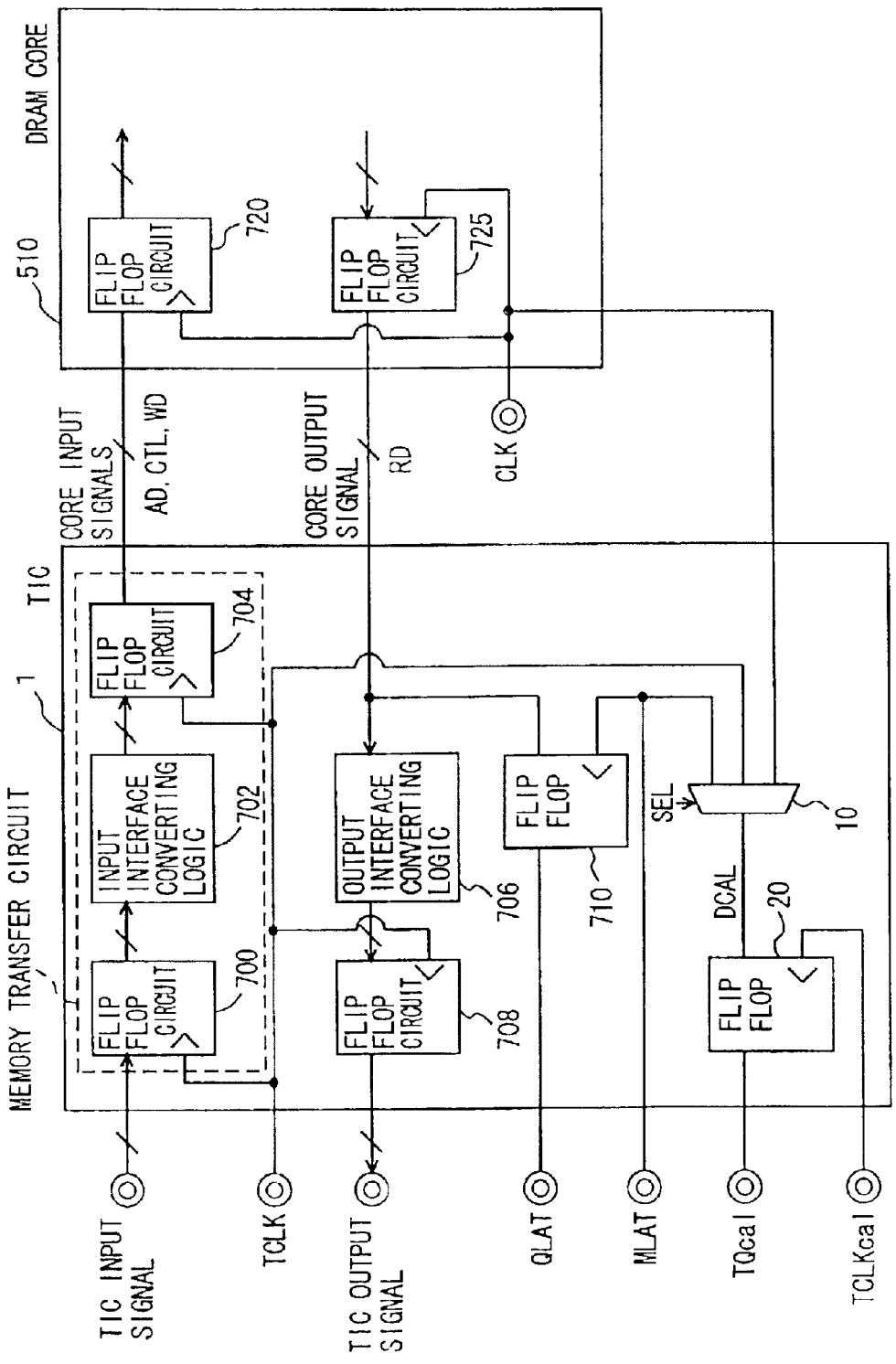
FIG. 1 is a diagram schematically showing the configuration of a test interface circuit according to a first embodiment of the present invention.
Figure 19:
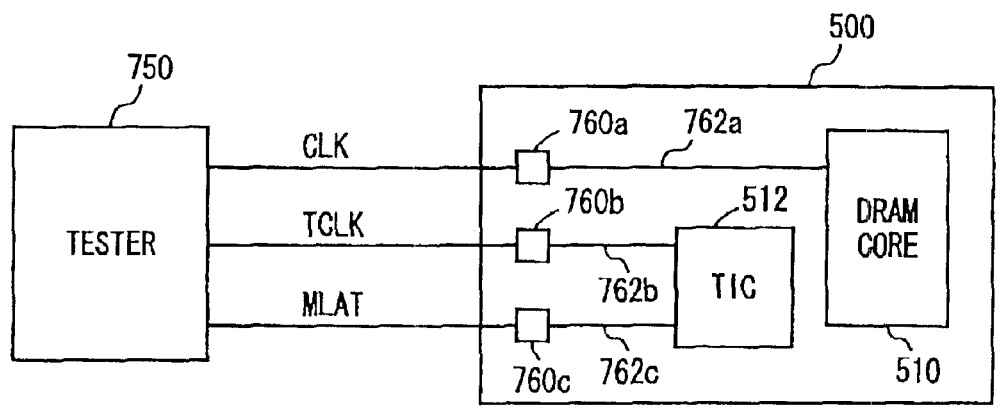
FIG. 19 is a diagram schematically showing a test environment of a conventional system LSI.
Figure 20:
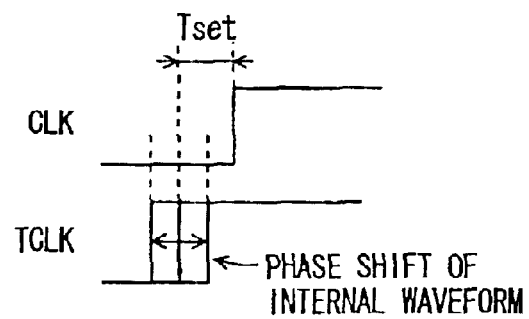
FIG. 20 is a diagram illustrating the disadvantage of the conventional test environment.

FIG. 1 is a diagram schematically showing the configuration of a test interface circuit according to a first embodiment of the present invention. The test interface circuit (TIC) 1 shown in FIG. 1 is different in configuration from test interface circuit 512 shown in FIG. 19 in the following points. Flip flop circuit 700, input interface converting logic 702 and flip flop circuit 704 form a memory transfer circuit of transferring signals/data to a memory core (DRAM core) synchronously with test clock signal TCLK.

Figure 17:
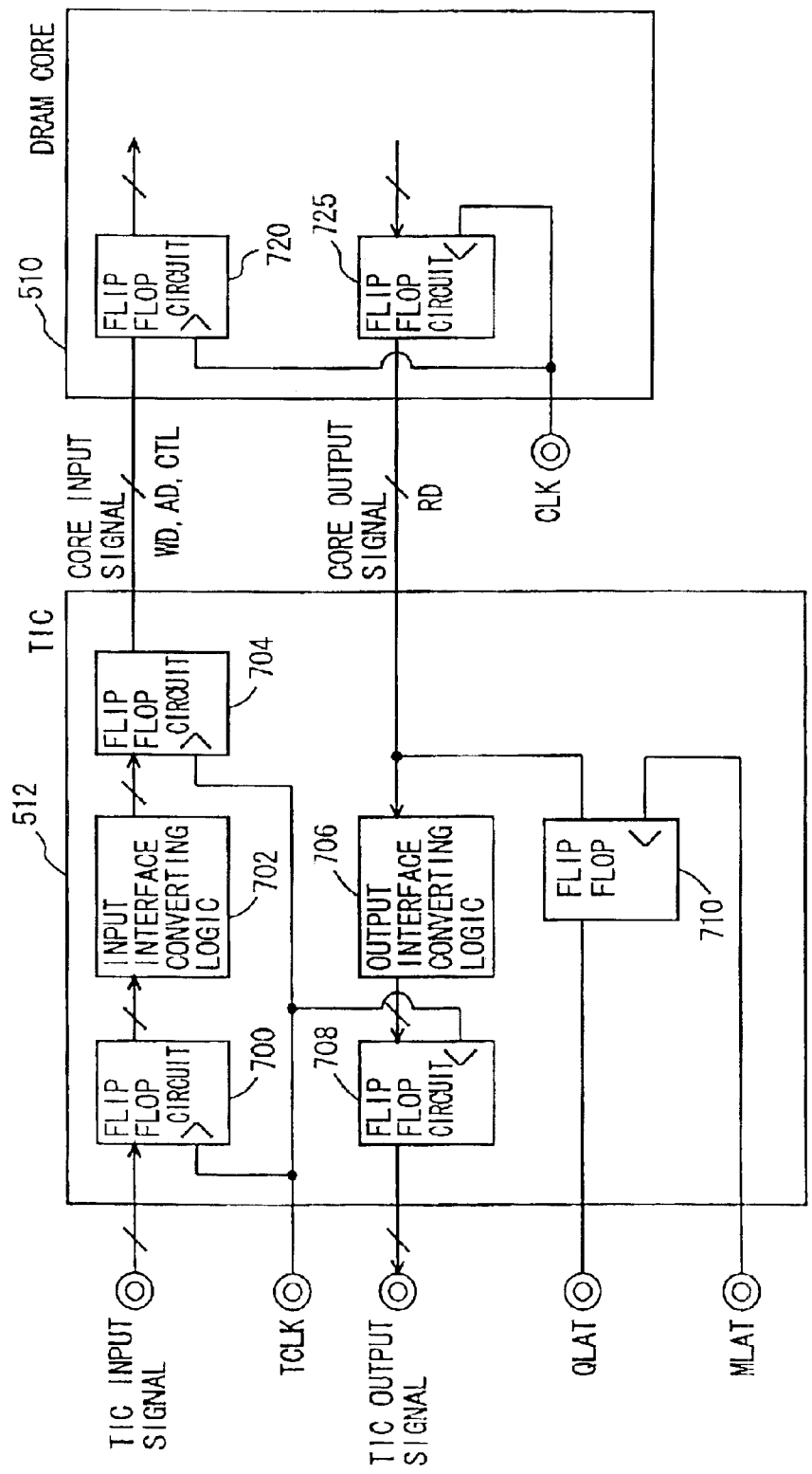
FIG. 17 is a diagram schematically showing the configuration of a part for measuring signal timing parameters of a conventional test interface circuit.
Figure 18:
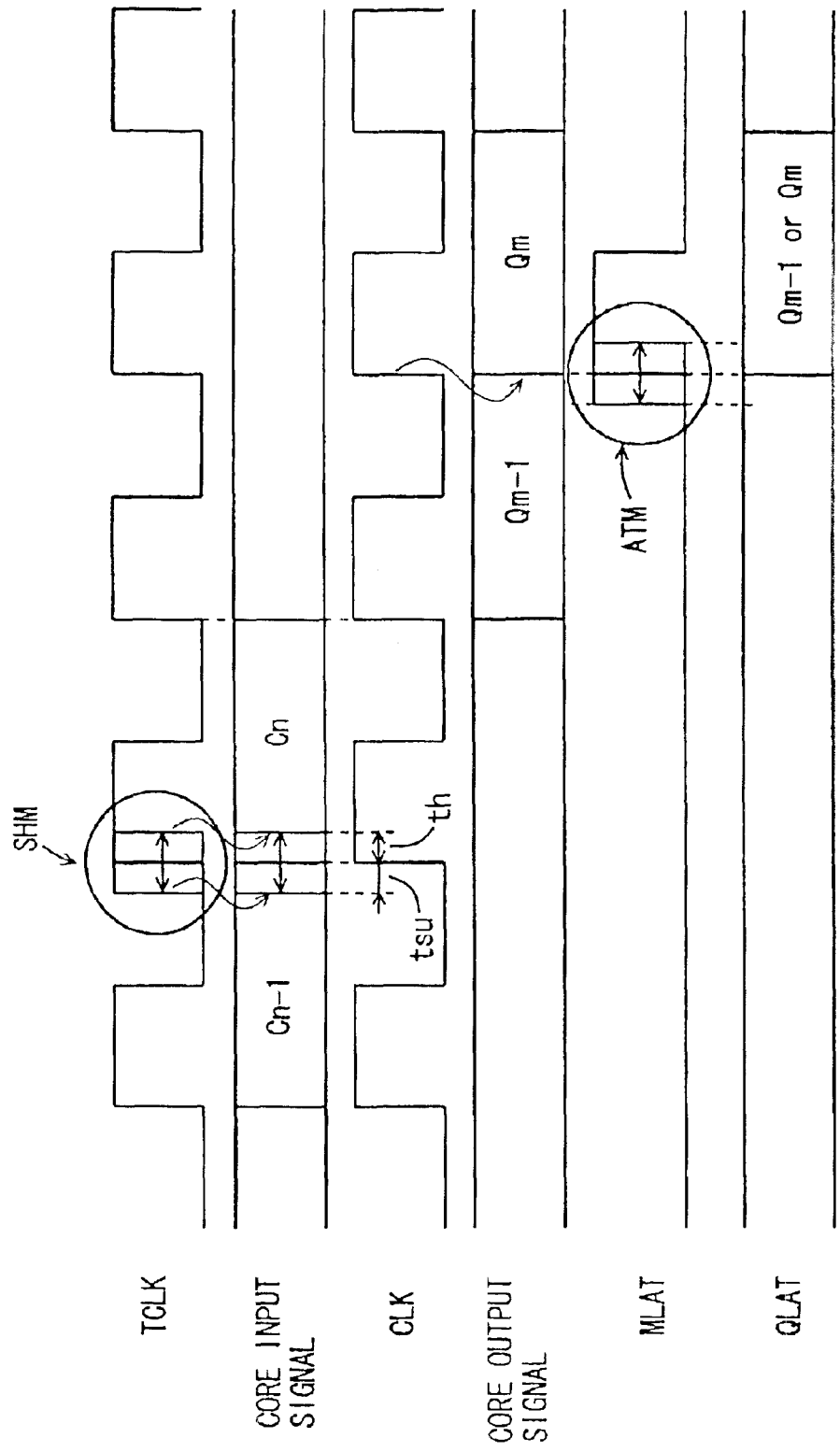
FIG. 18 is a timing chart representing the operation of measuring setup/hold time and access time in the conventional test interface circuit.

Specifically, a selecting circuit 10 for selecting one of latch timing signal MLAT, test clock signal TCLK and memory clock signal CLK in accordance with selection signal SEL, and a flip flop 20 for taking in and transferring an output signal DCAL of selecting circuit 10 synchronously with a correcting test clock signal TCLKcal are provided. An output TQcal of flip flop 20 is supplied to an external tester. The other configuration of test interface circuit 1 shown in FIG. 1 is the same as that of test interface circuit 512 shown in FIG. 17. The same reference numerals are allotted to corresponding components and the detailed description will not be repeated.

Selection signal SEL is generated on the basis of data set in a not-shown test mode register under control of the external tester. Selection signal SEL may be generated by decoding data stored in the mode register, or data themselves in the mode register may be used as the selection signal.

Flip flop 20 can employ any configuration as far as it takes in and latches output signal DCAL of selecting circuit 10 synchronously with the rising edge of correcting test clock signal TCLKcal and supplies the output signal TQcal at the rising edge of test clock signal TCLKcal. For example, flip flop 20 can be formed by latch circuits which are cascaded in two stages and operate synchronously with complementary clock signals.

A terminal for outputting correcting data TQcal and a terminal for receiving correcting test clock signal TCLKcal may be used while being multiplexing other pin terminals such as terminals of a TIC input signal and a TIC output signal in accordance with setting by a not-shown test mode register. Alternatively, in test interface circuit 1, a pin terminal dedicated to correcting data TQcal and a pin terminal dedicated to correcting test clock signal TCLKcal may be provided.

Figure 2:
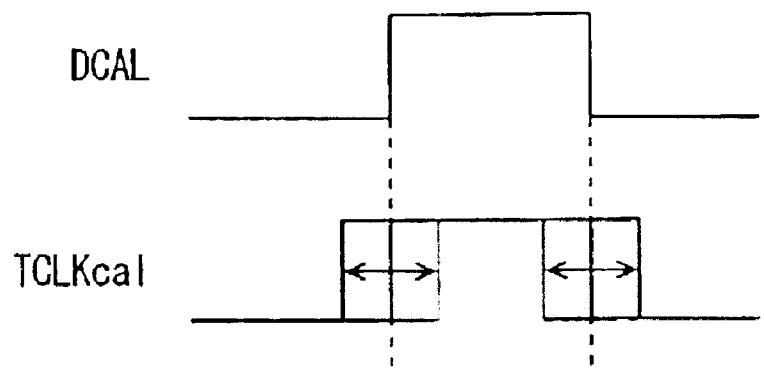
FIG. 2 is a timing chart representing the operation of the test interface circuit shown in FIG. 1.

FIG. 2 is a timing chart representing the operation of test interface circuit 1 shown in FIG. 1. Referring to FIG. 2, the operation of test interface circuit 1 shown in FIG. 1 will now be described.

Selecting circuit 10 selects one of latch timing signal MLAT, clock signal CLK and test clock signal TCLK in accordance with selection signal SEL and generates output signal DCAL. The rising timing of correcting test clock signal TCLKcal is changed under control of the external tester. Flip flop 20 takes in and latches output signal DCAL of selecting circuit 10 at the rising edge of correcting test clock signal TCLKcal, and generates correcting data TQcal. Correcting data TQcal is transferred to the external tester. In the external tester, the rising edge or falling edge of output signal DCAL of selecting circuit 10 is detected in accordance with the binary search method. By sequentially switching selection signal SEL, transition edges of latch timing signal MLAT, test clock signal TCLK and clock signal CLK are detected on the basis of correcting test clock signal TCLKcal.

Figure 3:
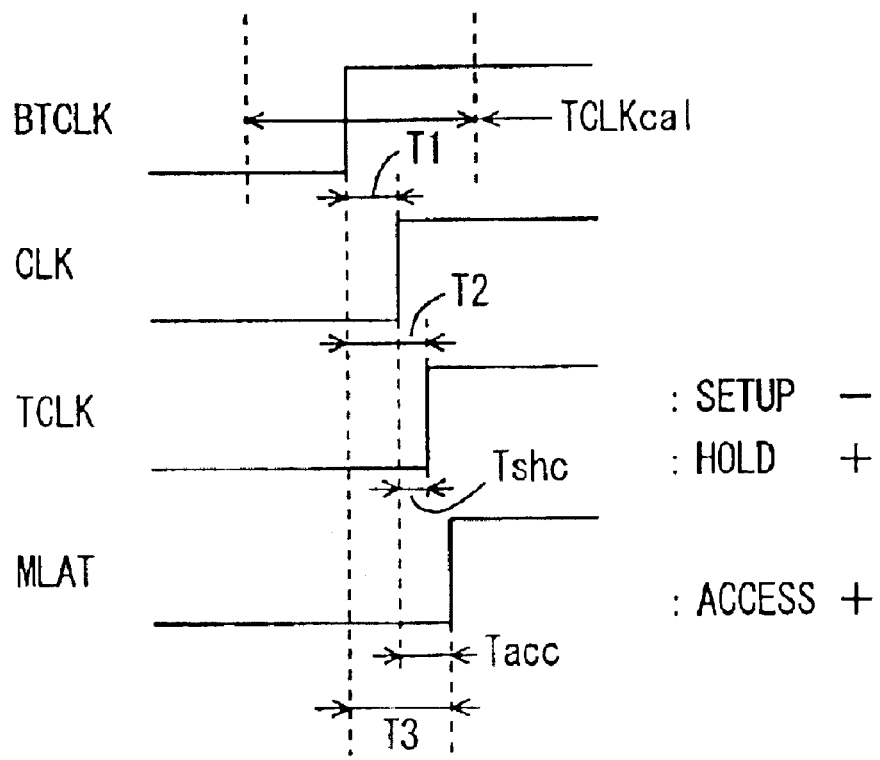
FIG. 3 is a diagram illustrating the operation of correcting setup time, hold time and access time in the first embodiment of the present invention.

FIG. 3 is a diagram showing an example of phase relationship of latch timing signal MLAT, test clock signal TCLK and clock signal CLK. As shown in FIG. 3, in the tester, correcting test clock signal TCLKcal has the phase changed using a basic test clock signal BTCLK as a reference, and then supplied to test interface circuit 1. Therefore, by using the phase of correcting test clock signal TCLKcal relative to basic test clock signal BTCLK, relative phase relationship of transition edges of output signal DCAL of selecting circuit 10, that is, latch timing signal MLAT, test clock signal TCLK and clock signal CLK can be detected. In FIG. 3, the rising edges of clock signal CLK, test clock signal TCLK and latch timing signal MLAT are lagged behind the rising edge of basic test clock signal BTCLK only by time periods T1, T2 and T3, respectively.

Therefore, the phase difference Tshc between test clock signal TCLK and dock signal CLK is given by time T2−T1, and the phase difference Tacc between latch timing signal MLAT and clock signal CLK is given by time T3−T1.

As shown in FIG. 3, where the phase difference Tshc between test clock signal TCLK and clock signal CLK is positive, the transfer timing of a signal transferred to the DRAM core is actually delayed by the time Tshc. Accordingly, actual setup time is shorter than a value set in the tester by time Tshc. On the other hand, at the time of measuring the hold time, the hold time is actually longer by the time Tshc. Therefore, at the time of measuring the setup time, the phase difference Tshc between test clock signal TCLK and clock signal CLK is subtracted from a measured value. At the time of measuring the hold time, the phase difference Tshc is added to a measured value. In such a manner, it is possible to obtain actual setup time and hold time.

As for an access time, at the timing shown in FIG. 3, the rising edge of latch timing signal MLAT is behind that of clock signal CLK by a time period Tacc. Therefore, transfer time of data from DRAM core 510 is actually longer by the time Tacc.

Data is transferred from test interface circuit 512 synchronously with the rising edge of test clock signal TCLK. Test clock signal TCLK is behind clock signal CLK by the time T1. However, a command is in a definite state in DRAM core 510 at the rising edge of clock signal CLK and data reading operation is executed in DRAM core 510 synchronously with clock signal CLK. Therefore, at the time of measuring the access time, it is unnecessary to consider the phase difference between test clock signal TCLK and clock signal CLK. When the phase relation between clock signal CLK and latch timing signal MLAT is measured, the access time can be corrected. Thus, not referring the set value in the tester, an actual access time can be obtained by adding phase difference (time) Tacc to a measured value.

FIG. 4 is a diagram schematically showing the configuration of selecting circuit 10 shown in FIG. 1. In FIG. 4, selecting circuit 10 includes: a selector 10a which is selected when a selection signal SLa is activated and generates output signal DCAL in accordance with latch timing signal MLAT when selected; a selector 10b which is selected when a selection signal SLb is activated and generates output signal DCAL in accordance with test clock signal TCLK when selected; and a selector 10c which is selected when a selection signal SLc is activated and generates output signal CAL in accordance with clock signal CLK when selected.

Each of selectors 10a to 10c may be formed of a CMOS (Complementary MOS) transmission gate, or of a tri-state buffer circuit. Selectors 10a to 10c are set in an output high impedance state when not selected.

In selecting circuit 10, a signal propagation delay amount from an input to an output is the same in selectors 10a to 10c. Therefore, the propagation delay can be made the same for latch timing signal MLAT, test clock signal TCLK and clock signal CLK. In a subsequent stage, output signal DCAL of selecting circuit 10 is transferred using common flip flop 20, so that the propagation delay in the signals MLAT, TCLK and CLK is the same. Thus, the relative phase relationship of the signals MLAT, TCLK and CLK can be accurately obtained without any adverse influence by propagation delay in selecting circuit 10 and flip flop 20.

As described above, according to the first embodiment of the present invention, the test clock signal, clock signal and test timing clock signal are taken in and transferred using the correcting test clock signal in the test interface circuit, and the relative phases of the signals are detected using the correcting test clock signal as a reference in the external tester. The actually occurring phase differences of the signals in the test interface circuit can be detected and the setup time, the hold time and the access time can be corrected with high precision. Thus, the setup time, the hold time and the access time can be measured accurately, a setup failure or other(s) can be detected, and reduction in the product yield can be suppressed.

Second Embodiment

Figure 5:
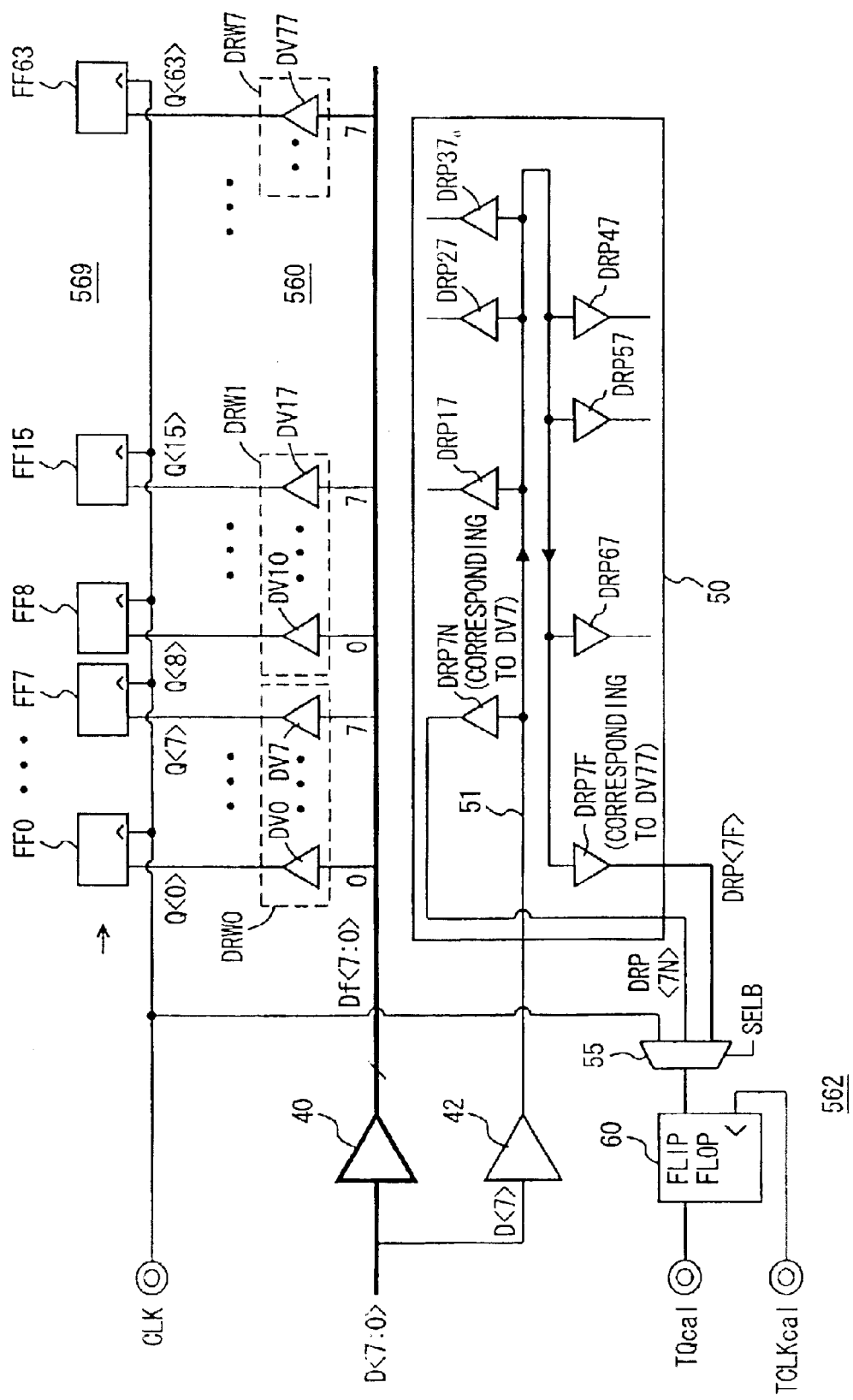
FIG. 5 is a diagram schematically showing the configuration of a main/part of a test interface circuit according to a second embodiment of the present invention.

FIG. 5 is a diagram schematically showing the configuration of a main part of a test interface circuit according to a second embodiment of the present invention. In FIG. 5, in a TIC data path 560 (560e or 560w), bus drive circuits DRW0 to DRW7 each for transferring 8-bit data are provided. A buffer circuit 40 having a large driving capability is provided to transfer data to drive circuits DRW0 to DRW7. By buffer circuit 40, 8-bit data Df<7:0> is generated from 8-bit data D<7:0> and transmitted to bus drive circuits DRW0 to DRW7. Each of bus drive circuits DRW0 to DRW7 includes drivers of eight bits. Bus drive circuit DRW0 has drivers DV0 to DV7, bus drive circuit DRW1 has drivers DV10 to DV17, and bus drive circuit DRW7 has drivers DV70 to DV77.

In correspondence to drivers DV0 to DV7, DV10 to DV17, . . . , DV70 to DV77, flip flops FF0 to FF63 are provided in a DRAM data path 569 (569e or 569w). Clock signal CLK is supplied to flip flops FF0 to FF63.

Write data WD to the DRAM core are subject to bit width expanding operation and therefore, the write data signal transfer path is different in the number of stages of buffer circuits and in interconnection delay, from other signal transfer paths for the control signals and address signal. Therefore, the setup/hold times are measured using a method different from that in the first embodiment.

Meanwhile, in the configuration shown in FIG. 5, the transfer path for the spare data bit is not shown. The set up time, the hold time and the access time are measured for the non-defective memory cells. Therefore, a defective memory cell is replaced with a spare memory cell, and the replacing spare memory cell is measured on the operating parameters. Therefore, there is particularly no need to measure the parameters such as the set up/hold/access time, dedicately to the spare memory cells.

Referring to FIG. 5, TIC control circuit 562 includes: a buffer 42 having the same transmission characteristics as those of buffers included in buffer circuit 40; and a replica circuit 50 having the same transfer characteristics as those of bus drive circuits DRW0 to DRW7, and generating signals at the same transfer timing as that of bus drive circuits DRW0 to DRW7 in accordance with an output signal of buffer 42.

Buffer 40 receives test data D<7>. In replica circuit 50, in correspondence to drivers DV7, DV17, . . . and DV77 each having the largest delay (the farthest driver from buffer 40) in each of bus drive circuits DRW0 to DRW7, buffers DRP7N, DRP17, DRP27, DRP37, DRP47, DRP57, DRP67 and DRP7F are provided. Replica buffer DRP7N corresponds to driver DV7 in bus drive circuit DRW0, and replica buffer DRP7F corresponds to driver DV77 in bus drive circuit DRW7.

In replica circuit 50, a signal line 51 for transferring an output signal of buffer 42 is folded back in its center portion, and replica buffer DRP7F corresponding to driver DV77 disposed in correspondence to the farthest point of the data bus is disposed in the input part of replica circuit 50. From the vicinity of the input part of replica circuit 50, data can be outputted at substantially the same timing as the timing of data outputting. from driver DV77 disposed in the farthest point in the bus drive circuit. In the event that signal line 51 is linearly arranged, signal propagation delay is caused in transmitting an output signal of the remote driver DRP7F to the input part of replica circuit 50, so that accurate measurement cannot be achieved.

Replica buffers DRP7N to DRP7F corresponding to the drivers for data bit D<7> are disposed to make the load of signal line 51 the same as the output load of each driver in drive circuit 40. Data bit D<7> is utilized for the following reason. In each of bus drive circuits DRW0 to DRW7, a driver having the longest delay time in data arrival is the farthest driver from buffer circuit 40. The setup time of the farthest driver in each of bus drive circuits DRW0 to DRW7 becomes the worst case, and it is necessary to measure the setup time on the worst case.

TIC control circuit 562 further includes: a selector 55 for selecting one of clock signal CLK and output signals of replica buffers DRP7N and DRP7F of replica circuit 50 in accordance with a selection signal SELB; and a flip flop 60 for taking in, latching and transferring an output signal of selector 55 synchronously with the rising edge of correcting test clock signal TCLKcal. An output signal TQcal of flip flop 60 is supplied to the external tester as a signal for correcting the phase of data.

Output signals of replica buffers DRP7N and DRP7F in replica circuit 50 are utilized for the following reasons.

The setup time is a time period in which input data is in a definite state relative to the rising edge of clock signal CLK, and the hold time indicates a retention time of the definite state of data after the rising edge. of clock signal CLK. Therefore, with respect to the setup time, an output signal of driver DV77 having a largest signal delay makes the worst case. Similarly, driver DV7 having the shortest delay time with respect to data bit D<7> makes the worst case in holding condition for data bit D<7>. Consequently, using an output signal of replica buffer DRP7F making the worst case for the hold time, the phase difference from clock signal CLK is measured by the external tester.

The worst case for the hold condition in more restrict sense is made by driver DV0 having the smallest delay in data bus drive circuits DRW0 to DRW7. Therefore, there may be provided configuration similar to replica circuit 50 for data bit D<0> for selecting the output signal of the replica buffer (configuration) of the smallest delay for clock correction to the hold condition.

In the configuration of replica circuit 50 shown in FIG. 5, however, if the delay times of a signal to drivers DV0 to DV7 are substantially negligible in drive circuit DRW0, clock correction with respect to the hold time of the worst case can be performed accurately using replica buffer DRP7N. Only by providing replica circuit 50 for data bit D<7>, both clock correction for the hold condition and clock-correction for the set up condition can be carried out, and a circuit occupying area can be reduced.

Selection signal SELB to selector 55 is set in a not-shown test mode register under control of the external tester, and one of clock signal CLK and output signals of replica buffers DRP7N and DRP7F is selected. In selector 55 as well, delay in signal propagation from the input part to the output part is the same for each signal.

Correcting test clock signal TCLKcal is the same as correcting test clock signal TCLKcal used in the first embodiment.

As described above, according to the second embodiment of the present invention, the replica circuit having the same transfer characteristic as that of the transfer path of test data is used, an output signal of the replica circuit and a memory clock signal are taken-in in accordance with the correcting test clock signal, and the phase difference between the clock signals and test data is measured. Consequently, the setup condition and the hold condition can be accurately measured also with respect to write data.

Third Embodiment

Figure 6:
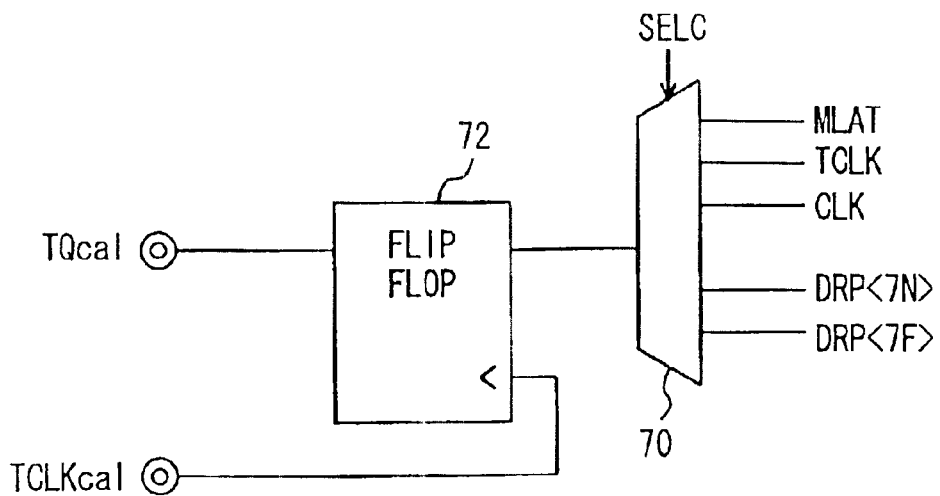
FIG. 6 is a diagram schematically showing the configuration of a main part of a test interface circuit according to a third embodiment of the present invention.

FIG. 6 is a diagram schematically showing the configuration of a main part of a test interface circuit according to a third embodiment of the present invention. In FIG. 6, the test interface circuit includes: a selecting circuit 70 for selecting one of latch timing signal MLAT, test clock signal TCLK, clock signal CLK, output signal DRP<7N> of replica buffer DRP7N shown in FIG. 5, and output signal DRP<7F> of replica buffer DRP7F in accordance with a selection signal SELC; and a flip flop 72 for taking in and transferring an output signal of selector 70 synchronously with the rising edge of a correcting test clock signal. Output signal TQcal of flip flop 72 is applied to the external tester. Selection signal SELC is stored in a not-shown test mode register under control of the external tester.

Signal propagation delay amount from the input part to the output part in selecting circuit 70 are the same for each signal. An output signal of selecting circuit 70 is transferred via common flip flop 72. Therefore, the signal propagation delay amounts in the path of the signals MLAT, TCLK, CLK, DRP<7N> and DRP<7F> are the same with each other. By using selection signal SELC, the relative phase of each signal on the basis of correcting test clock signal TLCKcal can be detected. The detecting operation is similar to those in the first and second embodiments.

In the case of the configuration shown in FIG. 6, the set up time, the hold time and the access time of the signals and data can be corrected by using selecting circuit 70 and flip flop 72, and the circuit occupying area can be reduced.

Modification

Figure 7:
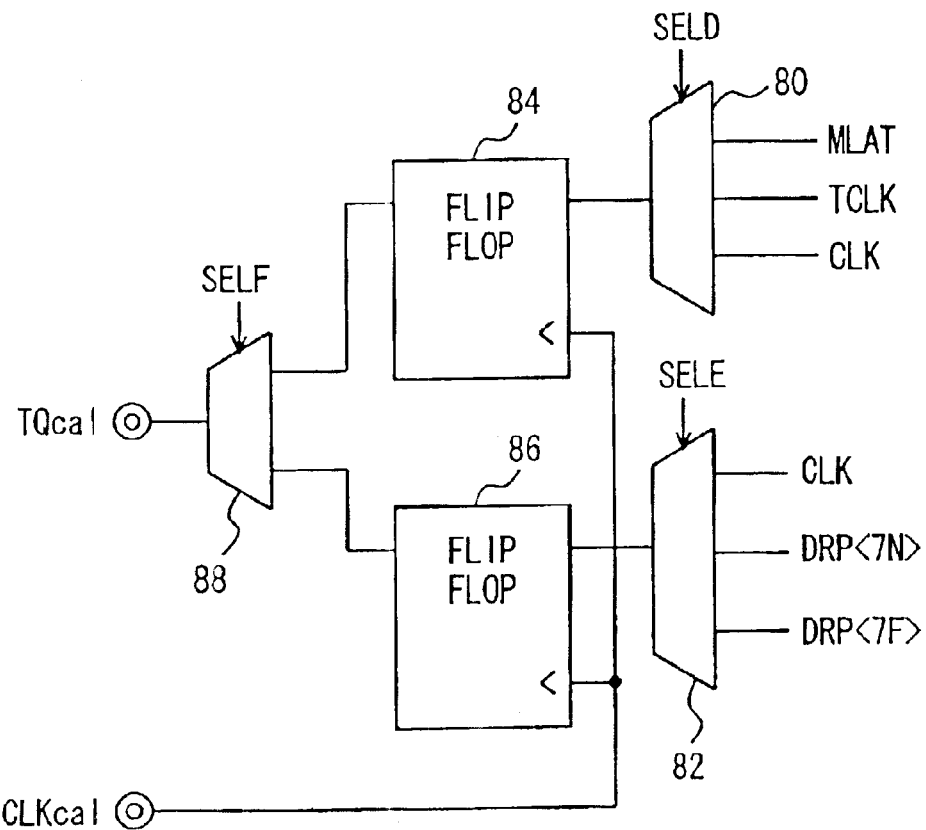
FIG. 7 is a diagram schematically showing another configuration of the test interface circuit according to the third embodiment of the present invention.
Figure 8:
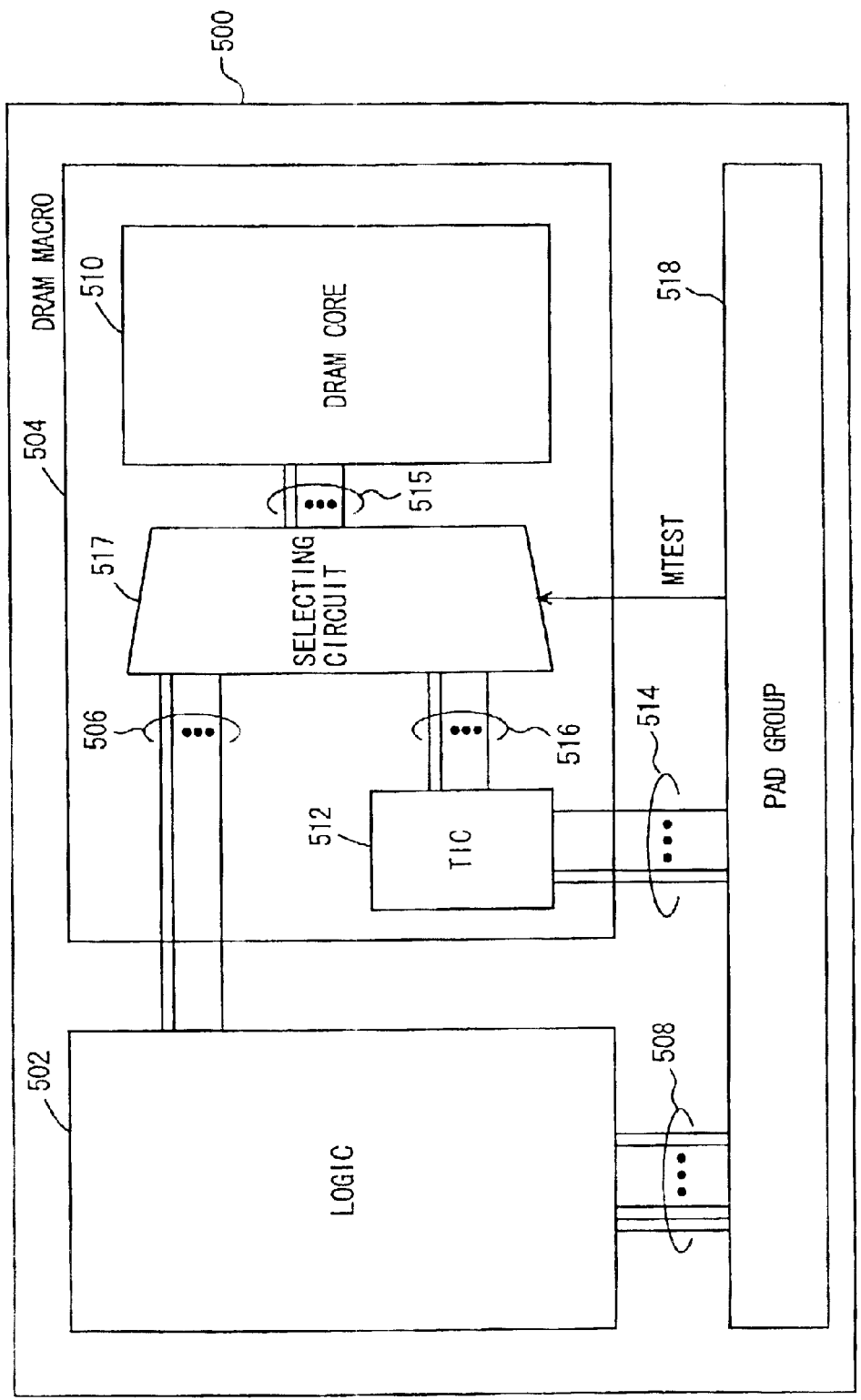
FIG. 8 is a diagram schematically showing the configuration of a conventional system LSI.
Figure 12:
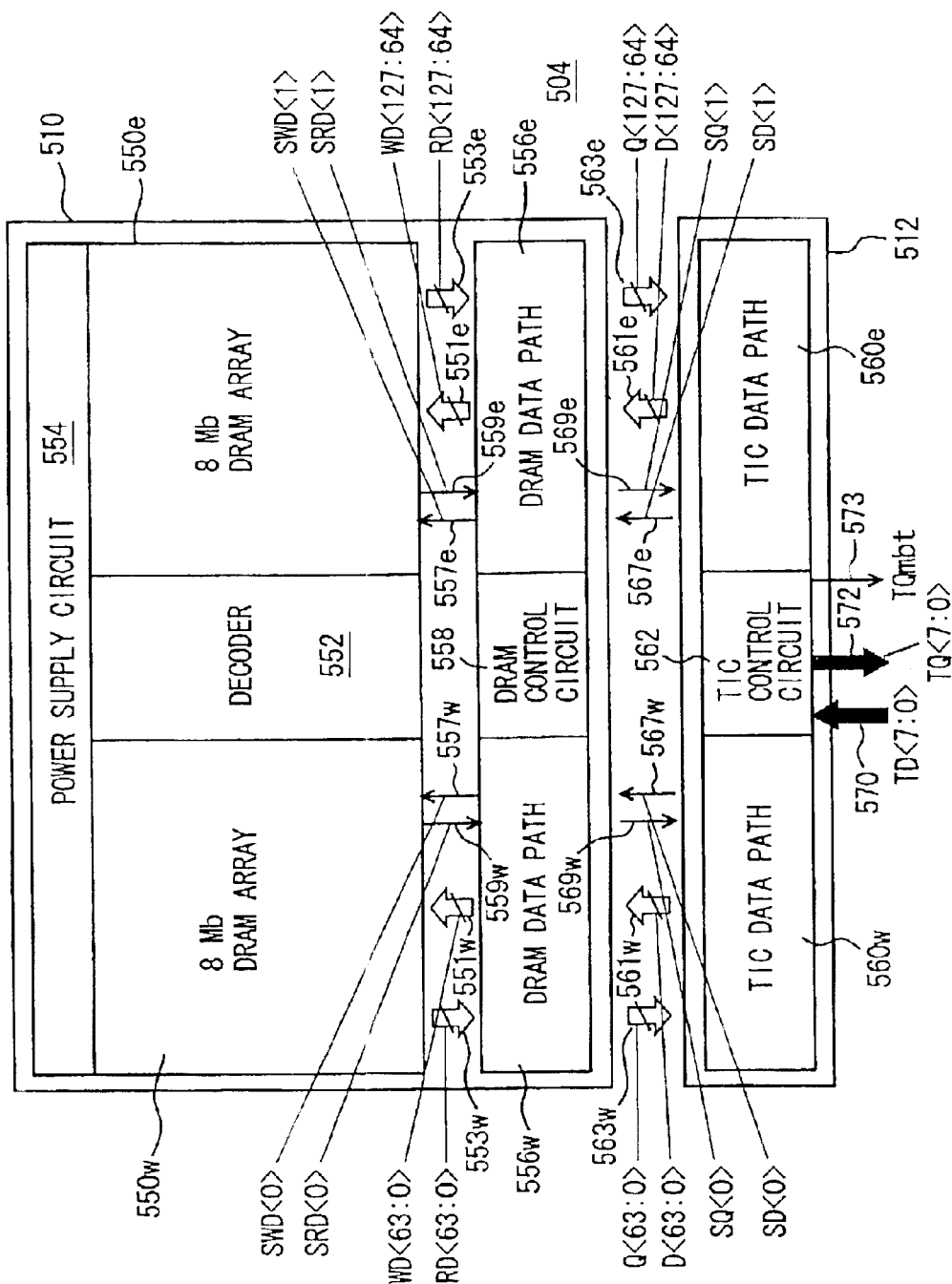
FIG. 12 is a diagram more specifically showing the configuration of the DRAM core and test interface circuit shown in FIG. 8.
Figure 13:
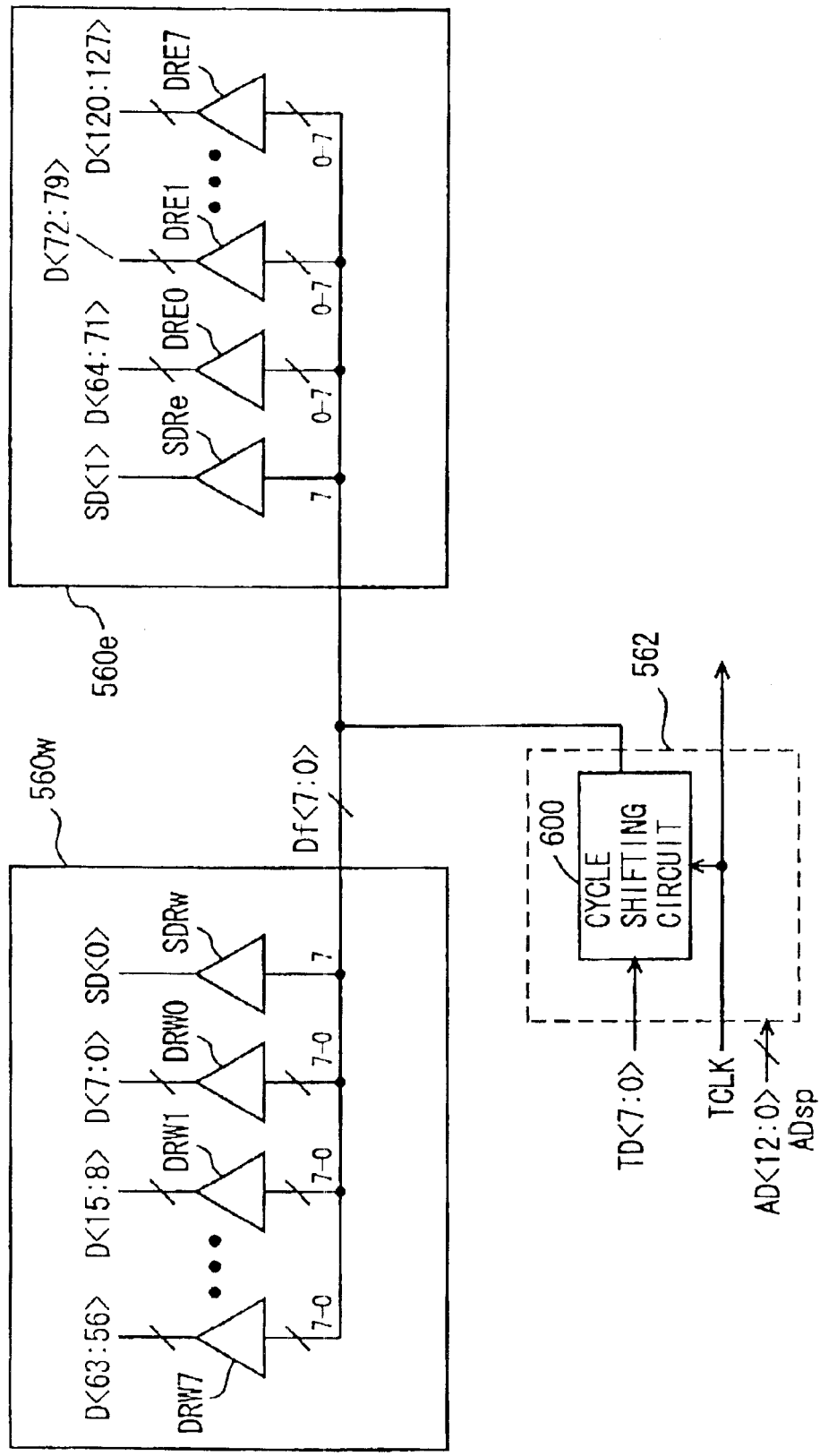
FIG. 13 is a diagram schematically showing the configuration of a data writing part of a TIC data path shown in FIG. 12.
Figure 14:
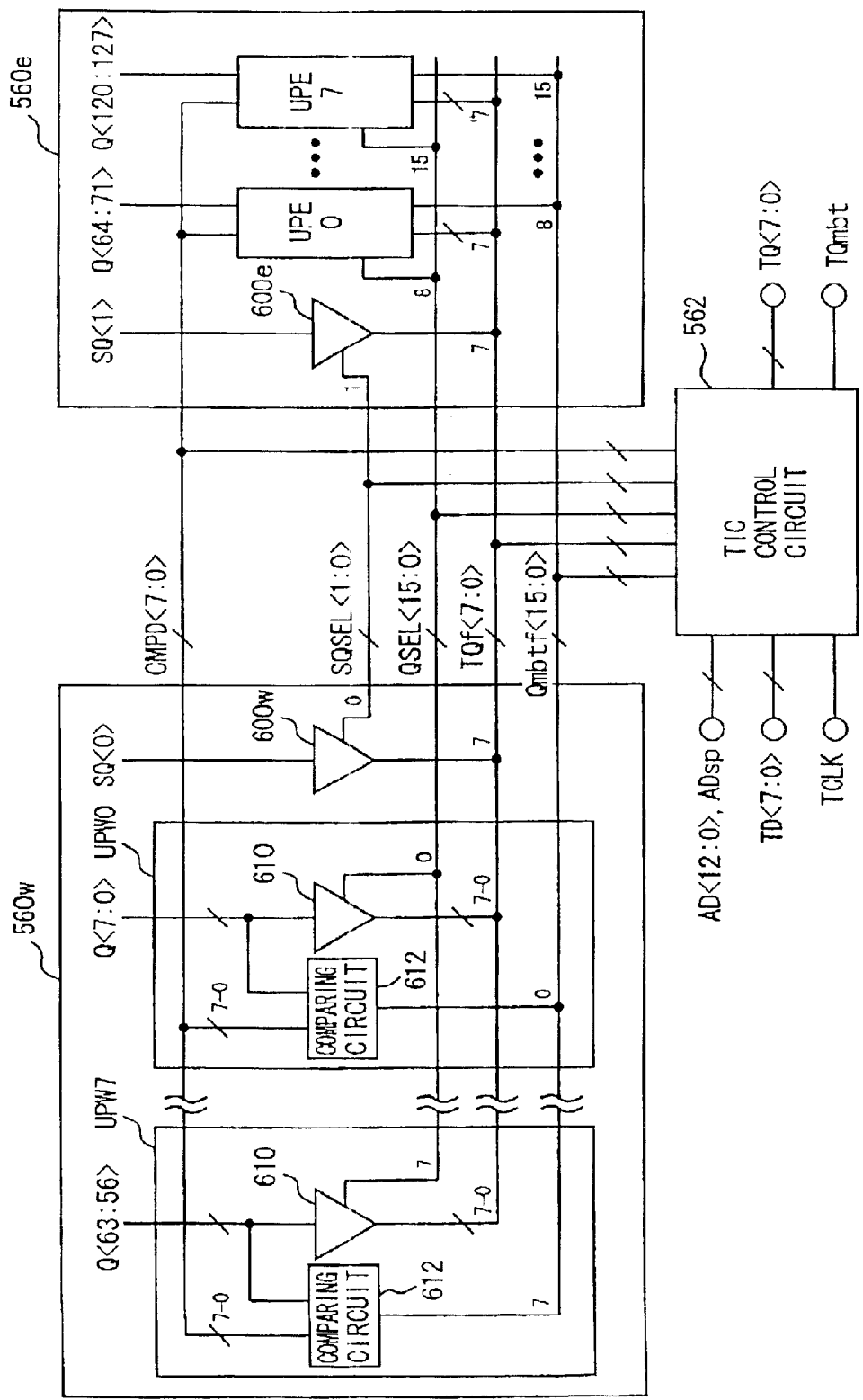
FIG. 14 is a diagram schematically showing the configuration of a data reading part of the TIC data path shown in FIG. 12.
Figure 15:
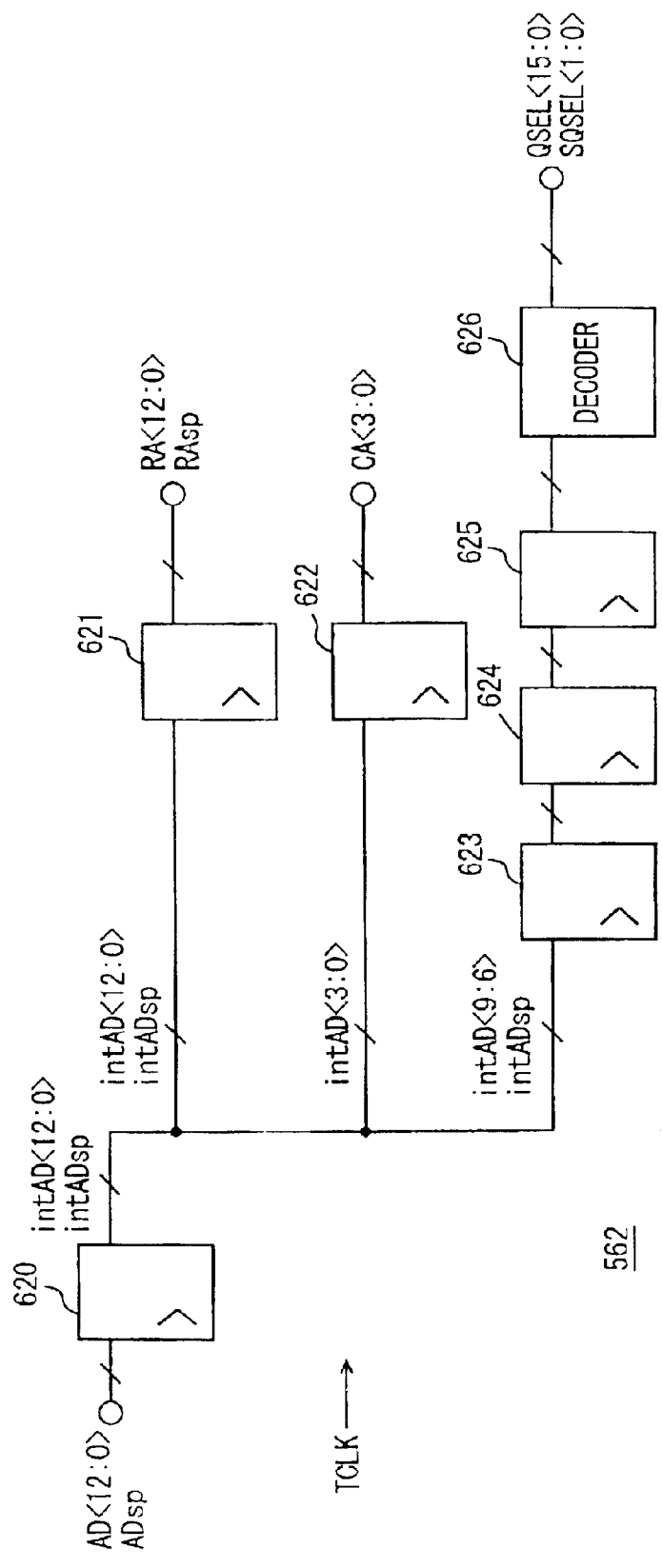
FIG. 15 is a diagram schematically showing the configuration of an TIC control circuit shown in FIG. 14.
Figure 16:
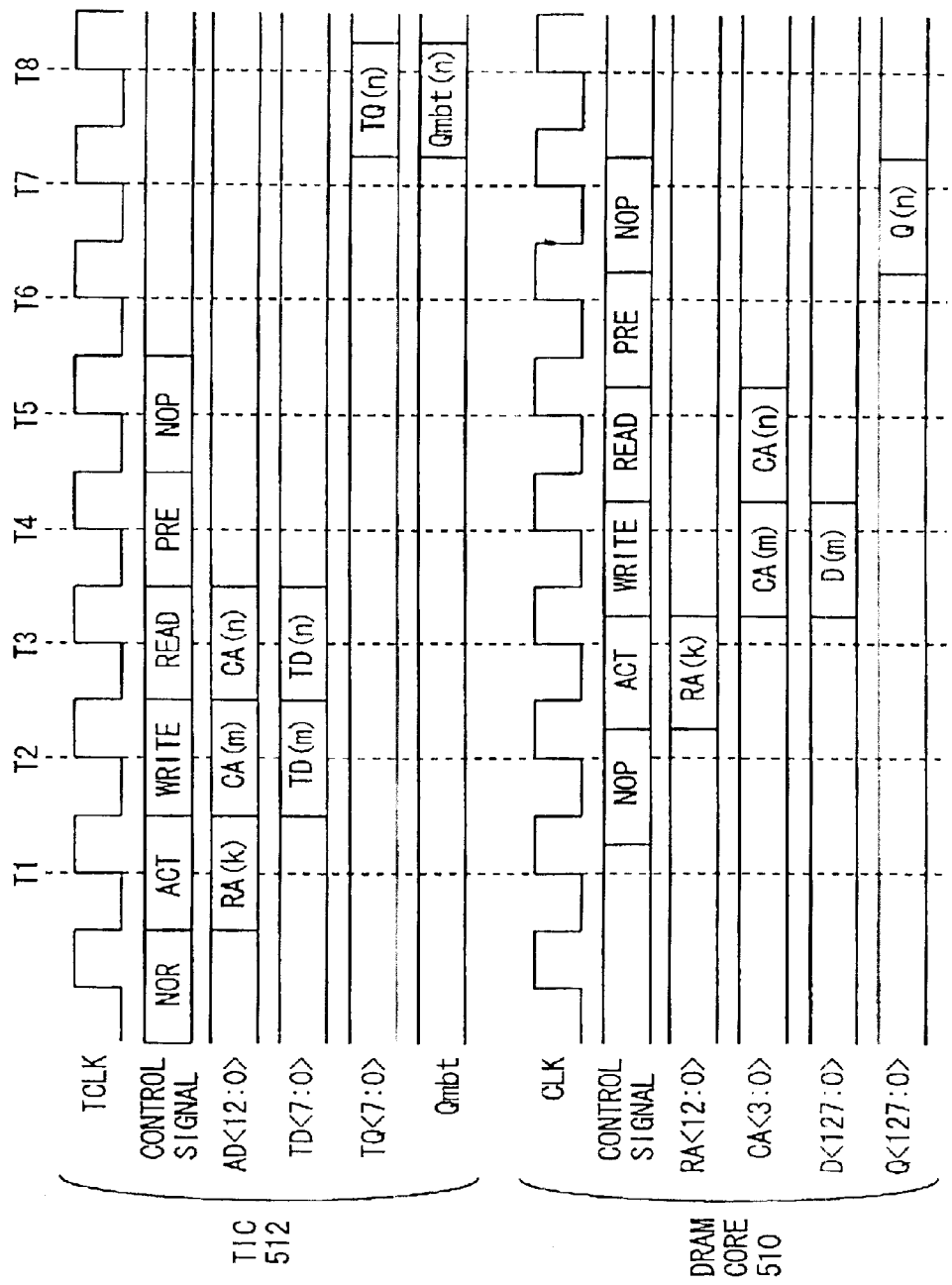
FIG. 16 is a timing chart representing the operations of the test interface circuit and DRAM core shown in FIGS. 12 to 15.

FIG. 7 is a diagram schematically showing the configuration of a main part of a test interface circuit of a modification of the third embodiment according to the present invention. The test interface circuit shown in FIG. 7 includes: a selecting circuit 80 for selecting one of latch timing signal MLAT, test clock signal TCLK and clock signal CLK in accordance with a selection signal SELD; and a selecting circuit 82 for selecting one of clock signal CLK, output signal DRP<7N> of replica buffer DRP7N, and output signal DRP<7F> of replica buffer DRP7F in accordance with a selection signal SELE. Selecting circuits 80 and 82 correspond to selecting circuit 10 shown in FIG. 1 and selecting circuit 55 shown in FIG. 5, respectively.

The test interface circuit further includes: a flip flop 84 for taking in and transferring an output signal of selecting circuit 80 synchronously with the rising edge of correcting test clock signal TCLKcal; a flip flop 86 for transferring an output signal of selecting circuit 82 synchronously with the rising edge of correcting test clock signal TCLKcal; and a selecting circuit 88 for selecting one of output signals of flip flops 84 and 86 in accordance with a selection signal SELF. From selecting circuit 88, data TQcal for correction is outputted to the external tester.

Signal propagation delay amounts from the input parts to the output parts of the signals in selecting circuits 80 and 82 are the same with each other. The operation characteristics, particularly, a response characteristic to correcting test clock signal TCLKcal of flip flops 84 and 86 are the same with each other.

In the configuration of the test interface circuit shown in FIG. 7, the respective configurations of the first and second embodiments are provided separately. Therefore, selecting circuit 82 and flip flop 86 can be disposed according to the position in which replica circuit 50 is disposed, and the flexibility in circuit layout is improved.

In the configuration shown in FIG. 7, one of clock signal CLK and output signals DRP<7N> and DRP<7F> of the replica buffer 50 is selected by selecting circuit 82, and therefore, clock signal CLK and output signals DRP<7N> and DRP<7F> of the replica buffer can be transferred via the same path. Thus, a phase difference between the clock signals and write data can be accurately detected. However, if the difference between the transfer characteristics of flip flops 84 and 86 is negligible, selecting circuit 82 may be configured to select one of outputs DRP<7N> and DRP<7F> of the replica buffer in accordance with selection signal SELE.

As described above, according to the modification of the third embodiment of the present invention, one of latch timing signal MLAT, test clock signal TCLK, clock signal CLK, and output signals DRP<7N> and DRP<7F> of the replica buffer is selected, and is taken in and transferred synchronously with the rising edge of correcting test clock signal TCLKcal. Thus, with the correcting test clock signal being a reference, a phase difference between signals/data can be accurately detected, and the set up time, hold time and access time can be accurately measured with respect to a signal and data.

Other Application

The test interface circuit of a DRAM assembled on the same semiconductor chip with a logic has been described above. However, the memory can be any memory assembled with a logic on a common semiconductor chip, and is not limited to a DRAM. The memory may be, for example, a clock synchronous SRAM (Static Random Access Memory) or a nonvolatile memory. In other words, the present invention can be applied to a test interface circuit for an embedded clock synchronous memory.

In test interface circuit 512, the flip flop is disposed in each of the input part and the output part of signals/data. An external signal/data is taken in at the rising edge of a clock signal, and transferred at the rising edge of the clock signal. Alternatively, latch circuits, operating complementarily to each other, may be disposed in the input and output parts for taking in an external signal/data synchronously with the rising edge of a dock signal, and for transferring the signal/data synchronously with the falling edge of the clock signal. In such configuration, the DRAM core takes in a signal/data synchronously with the rising edge of the clock signal.

As described above, according to the present invention, in the test interface circuit for an embedded clock synchronous memory, a phase difference between the internal signal/data and the internal clock signal can be measured. The signal parameters of the embedded memory can be accurately measured, and the product yield can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor circuit device comprising:
   a memory core operating synchronously with a memory dock signal;
   a memory transferring circuit transferring at least a signal to said memory core synchronously with a test clock signal;
   a timing selecting circuit receiving at least said memory clock signal and test clock signal, and selecting one of at least said memory clock signal and said test clock signal; and
   a timing transferring circuit for taking in and transferring externally an output signal of said timing selecting circuit synchronously with a correcting test clock signal.

2. The semiconductor circuit device according to claim 1, further comprising a latch transferring circuit for taking in and externally transferring at least data transferred from said memory core synchronously with a latch timing signal, wherein said timing selecting circuit selects one of said memory clock signal, and the latch timing signal in response to a selection indication signal.

3. The semiconductor circuit device according to claim 2, wherein delay time of the memory clock signal, delay time of the test clock signal, and a delay time of the latch timing signal from an input of said timing selecting circuit to an output of said timing transferring circuit are substantially identical.

4. The semiconductor circuit device according to claim 1, wherein
   said memory transfer circuit includes a data transferring circuit for transferring data included in the at least one signal to said memory core, and
   said semiconductor circuit device further comprises:
      a replica circuit having a data transfer characteristic identical to said data transferring circuit;
      a test data selecting circuit for selecting one of the memory clock signal and an output signal of said replica circuit; and
      a test data transferring circuit for taking in and transferring an output signal of said test data selecting circuit synchronously with the correcting test clock signal.

5. The semiconductor circuit device according to claim 4, wherein said test data transferring circuit and said timing transferring circuit share a latch circuit for taking in and transferring a signal received synchronously with the correcting clock signal.

6. The semiconductor circuit device according to claim 4, wherein said timing transferring circuit and said test data transferring circuit include respective latch circuits operating synchronously with the correcting test clock signal.

7. A semiconductor circuit device comprising:
   a memory core taking in received data synchronously with a memory clock signal;
   a memory transferring circuit for transferring multi-bit data to said memory core;
   a replica circuit having a transfer characteristic identical to said memory transferring circuit and simulating operation of said memory transferring circuit;
   a test data selecting circuit selecting one of the memory clock signal and an output signal of said replica circuit; and
   a test data transferring circuit for transferring an output signal of said test data selecting circuit synchronously with a correcting test clock signal.

8. The semiconductor circuit device according to claim 7, wherein
   said memory transferring circuit includes a plurality of bus drivers connected in parallel to a multi-bit data bus transferring test multi-bit data,
   said replica circuit includes a first replica driver corresponding to a first bus driver, and shortest in delay with respect to a predetermined test data bit in said memory transferring circuit, and a second replica driver corresponding to a second bus driver and longest in delay with respect to the predetermined test data bit of said memory transferring circuit, the first and second bus drivers being coupled to a common bus line of the multi-bit data bus, and said test data selecting circuit selects one of output signals of said first and second replica drivers and the memory clock signal.

9. The semiconductor circuit device according to claim 7, wherein said memory transferring circuit includes a plurality of buffers for receiving data on a multi-bit data bus and for generating data corresponding to multi-bit data supplied to said memory core, a predetermined number of said buffers being connected to each signal line of said multi-bit data bus, said replica circuit includes drivers in the predetermined number connected to a replica bus line and having an operation characteristic identical to said buffers of said memory transferring circuit, said replica bus signal line having a folded back structure.

10. The semiconductor circuit device according to claim 9, wherein said buffers of said memory transferring circuit are divided into a plurality of groups of the predetermined number, and said drivers of said replica circuit comprise replica drivers disposed in correspondence to said buffers for a common bit in the respective groups of said memory transferring circuit.

11. A semiconductor circuit device comprising:

a memory core operating synchronously with a memory clock signal;

a latch transferring circuit for taking in a signal transferred from said memory core synchronously with a latch timing signal, and transferring a latched signal externally; and a test transferring circuit for selecting one of the memory clock signal and the latch timing signal in accordance with a selection signal, and externally transferring the signal selected, synchronously with a correcting clock signal.

12. The semiconductor circuit device according to claim 11, wherein said test transferring circuit includes:

a selecting circuit for selecting one of the memory clock signal and the latch timing signal in accordance with the selection signal; and a latch circuit for taking in and transferring an output signal of said selecting circuit in accordance with the correcting clock signal.

* * * * *